United States Patent
Hsiao et al.

(10) Patent No.: US 10,579,518 B2
(45) Date of Patent: Mar. 3, 2020

(54) MEMORY MANAGEMENT METHOD AND STORAGE CONTROLLER

(71) Applicant: Shenzhen EpoStar Electronics Limited CO., Shenzhen (CN)

(72) Inventors: Yu-Hua Hsiao, Hsinchu County (TW); Li-Hsun Liu, Taoyuan (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 30 days.

(21) Appl. No.: 16/114,248

(22) Filed: Aug. 28, 2018

(65) Prior Publication Data
US 2019/0391914 A1  Dec. 26, 2019

(30) Foreign Application Priority Data
Jun. 20, 2018 (TW) .............................. 107121188 A

(51) Int. Cl.
*G11C 16/34* (2006.01)
*G06F 12/02* (2006.01)
*G06F 11/07* (2006.01)

(52) U.S. Cl.
CPC ........ *G06F 12/0246* (2013.01); *G06F 11/076* (2013.01); *G11C 16/34* (2013.01)

(58) Field of Classification Search
CPC ..................................................... G11C 16/26
USPC ..................................................... 365/189.07
See application file for complete search history.

(56) References Cited

U.S. PATENT DOCUMENTS

| 2014/0112080 A1* | 4/2014 | Carissimi | G11C 7/06 365/189.07 |
| 2016/0042797 A1* | 2/2016 | Kim | G11C 16/26 714/764 |
| 2016/0049203 A1* | 2/2016 | Alrod | G11C 16/26 714/2 |
| 2016/0155494 A1* | 6/2016 | Kim | G11C 11/5628 365/185.03 |
| 2016/0172045 A1* | 6/2016 | Shukla | G11C 16/0483 365/185.12 |
| 2017/0365300 A1* | 12/2017 | Danon | G11C 16/26 |

* cited by examiner

*Primary Examiner* — Min Huang
(74) *Attorney, Agent, or Firm* — JCIPRNET

(57) ABSTRACT

A memory management method is provided. The method includes selecting a target physical programming unit; using a first read voltage corresponding to a first type physical page of the target physical programming unit to read a plurality of target memory cells of the target physical programming unit, so as to calculate a first bit value ratio; if the first bit value ratio is not smaller than a first preset threshold, using a second read voltage corresponding to the first type physical page of the target physical programming unit to read the plurality of target memory cells of the target physical programming unit, so as to calculate a second bit value ratio; and determining whether the first type physical page of the target physical programming unit is empty by comparing the first bit value ratio and the second bit value ratio.

12 Claims, 14 Drawing Sheets

MEMORY MANAGEMENT METHOD AND STORAGE CONTROLLER

CROSS-REFERENCE TO RELATED APPLICATION

This application claims the priority benefit of Taiwan application serial no. 107121188, filed on Jun. 20, 2018. The entirety of the above-mentioned patent application is hereby incorporated by reference herein and made a part of this specification.

BACKGROUND OF THE INVENTION

1. Field of the Invention

The invention relates to a memory management method, and in particular, to a memory management method and a storage controller that are applicable to a storage device configured with a rewritable non-volatile memory module.

2. Description of Related Art

For a storage device configured with a rewritable non-volatile memory module, determining/identifying a location of an empty page (empty storage unit) is a very important process. The reason is that a storage controller of the storage device needs to identify whether a storage unit is empty, so as to actually manage all available storage space or allocate/manage unused storage space. In addition, if a used storage unit can be precisely identified, it helps the storage controller maintain stored data.

Generally, when the storage controller needs to determine whether a storage unit is empty, the storage controller reads the storage unit, to determine whether the storage unit is empty according to a determining result of whether the number of bit values "1" that are read is greater than a preset value.

However, after the stored data is stored for a long time, the foregoing conventional method causes erroneous determining of an empty storage unit. In a serious case, if a storage unit that is wrongly determined to be empty actually stores data, the data may be damaged or there is a difficulty in managing and identifying storage space.

Therefore, how to improve accuracy of an empty storage unit determining operation (also referred to as an empty unit determining operation or an empty page determining operation) to further improve the storage space management efficiency of the rewritable non-volatile memory module is one of topics of persons skilled in the art.

SUMMARY OF THE INVENTION

The invention provides a memory management method (also referred to as an empty storage unit management method) and a storage controller, to accurately identify an empty storage unit, thereby improving the efficiency of managing use space of a storage device.

One embodiment of the invention provides a memory management method applicable to a storage device configured with a rewritable non-volatile memory module. The rewritable non-volatile memory module includes a plurality of physical programming units, and each of the plurality of physical programming units includes a plurality of memory cells. The method includes: selecting a target physical programming unit from the plurality of physical programming units; using a first read voltage corresponding to a first type physical page of the target physical programming unit to read a plurality of target memory cells of the target physical programming unit, to identify a plurality of first target memory cells storing a first bit value in the plurality of target memory cells, and calculating a first bit value ratio based on the plurality of first target memory cells and the plurality of target memory cells; if the first bit value ratio is not less than a first preset threshold, using a second read voltage corresponding to the first type physical page of the target physical programming unit to read the plurality of target memory cells, to identify a plurality of second target memory cells storing the first bit value in the plurality of target memory cells, and calculating a second bit value ratio based on the plurality of second target memory cells and the plurality of target memory cells, wherein the second read voltage is different from the first read voltage, and the first read voltage and the second read voltage are used for identifying a bit value stored on the first type physical page of the target physical programming unit; and determining whether the first type physical page of the target physical programming unit is empty by comparing the first bit value ratio and the second bit value ratio.

One embodiment of the invention provides a storage controller applicable to a storage device configured with a rewritable non-volatile memory module. The storage controller includes a connection interface circuit, a memory interface control circuit, an empty unit management circuit unit, and a processor. The connection interface circuit is configured to be coupled to a host system. The memory interface control circuit is configured to be coupled to the rewritable non-volatile memory module. The rewritable non-volatile memory module includes a plurality of physical programming units, and each of the plurality of physical programming units includes a plurality of memory cells. The processor is coupled to the connection interface circuit, the memory interface control circuit, and the empty unit management circuit unit. The processor selects a target physical programming unit from the plurality of physical programming units to instruct the empty unit management circuit unit to perform an empty unit identification operation on the target physical programming unit. In the empty unit identification operation, the empty unit management circuit unit is configured to: use a first read voltage corresponding to a first type physical page of the target physical programming unit to read a plurality of target memory cells of the target physical programming unit, to identify a plurality of first target memory cells storing a first bit value in the plurality of target memory cells, and calculate a first bit value ratio based on the plurality of first target memory cells and the plurality of target memory cells. If the first bit value ratio is not less than a first preset threshold, the empty unit management circuit unit is further configured to: use a second read voltage corresponding to the first type physical page of the target physical programming unit to read the plurality of target memory cells, to identify a plurality of second target memory cells storing the first bit value in the plurality of target memory cells, and calculate a second bit value ratio based on the plurality of second target memory cells and the plurality of target memory cells. The second read voltage is different from the first read voltage, and the first read voltage and the second read voltage are used for identifying a bit value stored on the first type physical page of the target physical programming unit. The empty unit management circuit unit is further configured to determine whether the first type physical page of the target physical programming unit is empty by comparing the first bit value ratio and the second bit value ratio.

Based on the above, according to the memory management method and the storage controller provided in the embodiments of the invention, different bit value ratios obtained by using read voltages may be used for identifying whether a storage unit is empty, to improve the empty storage unit identification accuracy, thereby improving the efficiency of managing used space and unused space by the storage device.

In order to make the aforementioned and other objectives and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
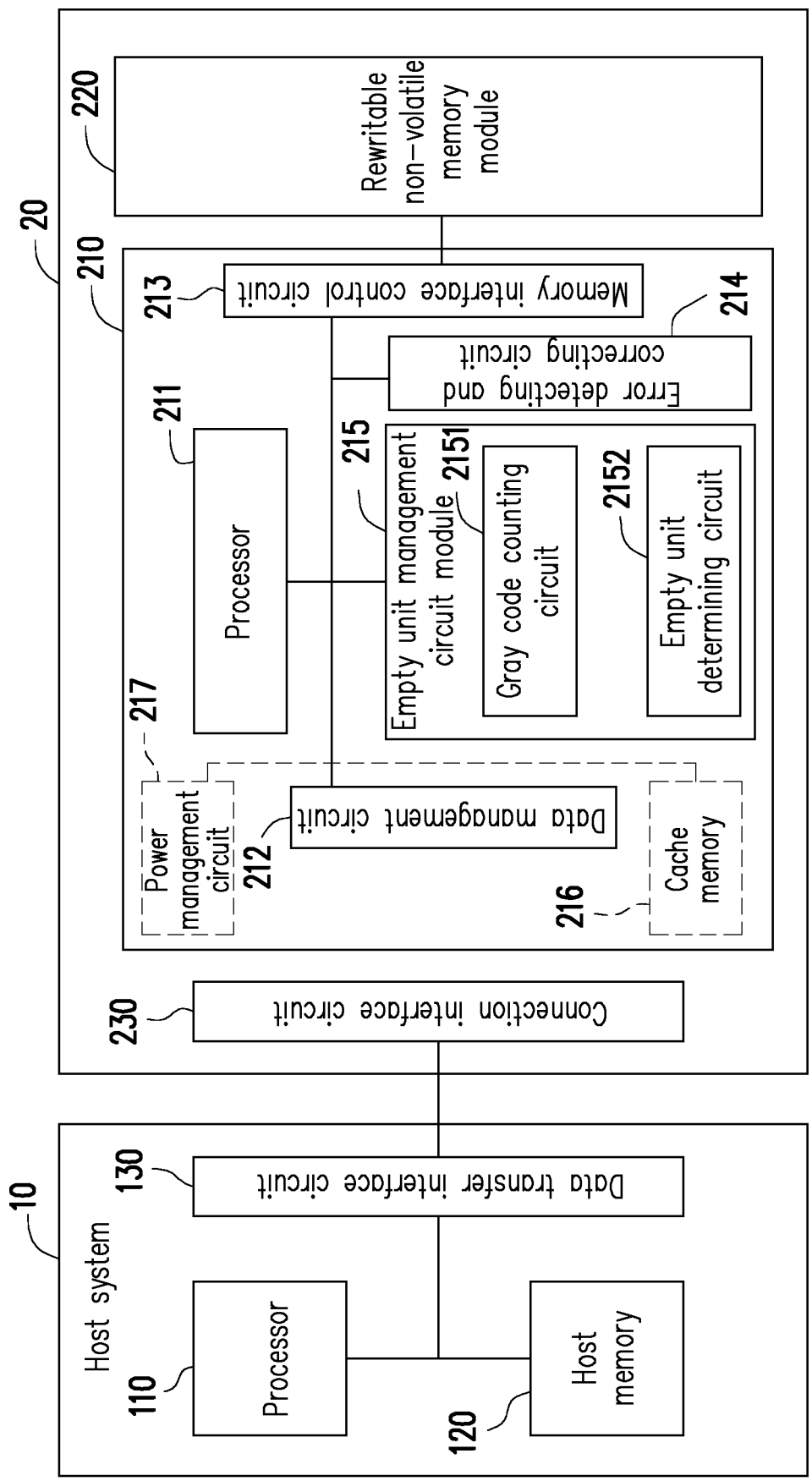
FIG. 1 is a block schematic diagram of a host system and a storage device according to one embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In the embodiment, a storage device includes a rewritable non-volatile memory module and a storage controller (also referred to as storage controller or a storage control circuit). In addition, the storage device is used together with a host system such that the host system can write data into the storage device or read data from the storage device.

FIG. 1 is a block schematic diagram of a host system and a storage device according to one embodiment of the invention.

Referring to FIG. 1, a host system 10 includes a processor 110, a host memory 120 and a data transfer interface circuit 130. In the embodiment, the data transfer interface circuit 130 is coupled to (also referred to as electrically connected to) the processor 110 and the host memory 120. In another embodiment, the processor 110, the host memory 120 and the data transfer interface circuit 130 are coupled to one another using a system bus.

A storage device 20 includes a storage controller 210, a rewritable non-volatile memory module 220 and a connection interface circuit 230. The storage controller 210 includes a processor 211, a data management circuit 212 and a memory interface control circuit 213.

In the embodiment, the host system 10 is coupled to the storage device 20 via the data transfer interface circuit 130 and the connection interface circuit 230 of the storage device 20 to perform data-accessing operation. For example, the host system 10 may store the data in the storage device 20 or read data from the storage device 20 via the data transfer interface circuit 130.

In the embodiment, the processor 110, the host memory 120 and the data transfer interface circuit 13 may be disposed on a motherboard of the host system 10. The number of the data transfer interface circuit 130 may be one or more. Via the data transfer interface circuit 130, the motherboard may be coupled to the storage device 20 in a wired or a wireless manner. The storage device 20 may be, for example, a flash drive, a memory card, a solid state drive (SSD) or a wireless memory storage device. The wireless memory storage device may be a memory storage device using various wireless communication technologies such as a near field communication (NFC) memory storage device, a WiFi memory storage device, a Bluetooth memory storage device or a low-power consumption Bluetooth memory storage device (e.g., iBeacon) and so on. In addition, the motherboard may be coupled to various I/O devices such as a global positioning system (GPS) module, a network interface card, a wireless transfer device, a keyboard, a screen, a speaker and so on via the system bus.

In the embodiment, the data transfer interface circuit 130 and the connection interface circuit 230 are interface circuits that are compatible with the Peripheral Component Interconnect Express (PCI Express) standard. Meanwhile, the transfer of data between the data transfer interface circuit 130 and the connection interface circuit 230 is performed by using a Non-Volatile Memory express (NVMe) communication protocol.

However, it should be understood that the invention is not limited thereto. The data transfer interface circuit 130 and the connection interface circuit 230 may comply with the Parallel Advanced Technology Attachment (PATA) standard, the Institute of Electrical and Electronic Engineers (IEEE) 1394 standard, the Serial Advanced Technology Attachment (SATA) standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the Multi-Chip Package interface standard, the Multi Media Card (MMC) interface standard, the eMMC interface standard, the Universal Flash Storage (UFS) interface standard, the eMCP interface standard, the CF interface standard, the Integrated Device Electronics (IDE) standard or other suitable standards. In addition, in another embodiment, the connection interface circuit 230 may be packaged in one chip along with the storage controller 210; alternatively, the connection interface circuit 230 may be disposed outside a chip containing the storage controller 210.

In the embodiment, the host memory 120 is used for temporarily storing the command or data executed by the processor 110. For example, in the exemplary embodiment, the host memory 120 may be a dynamic random access memory (DRAM), a static random access memory (SRAM) and so on; but it should be indicated that the invention is not limited thereto. The host memory 120 may be other suitable memories.

The storage controller 210 is used for executing a plurality of logic gates or control commands implemented in a hardware form or a firmware form, and performs data writing, data reading and data erasing operations on the rewritable non-volatile memory module 220 according to the command of the host system 10.

More specifically, the processor 211 of the storage controller 210 is a hardware that has a computing capability for controlling the overall operation of the storage controller 210. Specifically, the processor 211 includes a plurality of control commands. The control commands are executed to perform data writing, data reading and data erasing operations when the storage device 20 is operated.

It should be mentioned that, in the embodiment, the processor 110 and processor 211 are, for example, a central processing unit (CPU), a micro-processor, or other programmable unit (Microprocessor), a digital signal processor (DSP), a programmable controller, an application specific integrated circuit (ASIC), a programmable logic device (PLD) or other similar circuit component, which should not be construed as a limitation to the invention.

In one embodiment, the storage controller 210 further includes a read-only memory (not shown) and a random access memory (not shown). In particular, the read-only memory has a boot code. When the storage controller 210 is enabled, the processor 211 executes the boot code first to load the control command stored in the rewritable non-volatile memory module 220 into the random access memory of the storage controller 210. Thereafter, the processor 211 runs the control commands to perform data writing, data reading and data erasing operations and the like. In another embodiment, the control command of the processor 211 may be stored in a specific area of the rewritable non-volatile memory module 220, for instance, in a physical storage unit in the rewritable non-volatile memory module 220 that is specifically for storing system data, as a program code.

In the embodiment, as described above, the storage controller 210 further includes the data management circuit 212 and the memory interface control circuit 213. It should be pointed out that the operation executed by each component of the storage controller 220 may be considered as the operation executed by the storage controller 220.

Specifically, the data management circuit 212 is coupled to the processor 211, the memory interface control circuit 213 and the connection interface circuit 230. The data management circuit 212 receives the command of the processor 211 to perform transfer of data. For example, data is read from the host system 10 (e.g. host memory 120) via the connection interface circuit 230, and the read data is written into the rewritable non-volatile memory module 220 via the memory interface control circuit 213 (e.g., perform writing operation according to the write command from the host system 10). In another example, the data is read from one or more physical units of the rewritable non-volatile memory module 220 via the memory interface control circuit 213, and the read data is written into the host system 10 via the connection interface circuit 230 (e.g., perform reading operation according to the read command from the host system 10). In another embodiment, the data management circuit 212 may be integrated into the processor 211.

The memory interface control circuit 213 is configured to receive an instruction of the processor 211 (or an empty unit management circuit module 215), and perform writing (also referred to as programming), reading or erasing operation on the rewritable non-volatile memory module 220 by cooperating with the data management circuit 212. For example, according to an instruction of the empty unit management circuit module 215, a particular read voltage is used for performing reading operation on a storage unit of the rewritable non-volatile memory module 220.

For example, the processor 211 may execute a write command sequence to instruct the memory interface control circuit 213 to write the data into the rewritable non-volatile memory module 220; the processor 211 may execute a read command sequence to instruct the memory interface control circuit 213 to read data from one or more physical units (also referred to as target physical unit) of the rewritable non-volatile memory module 220 corresponding to the read command; the processor 211 may execute an erase command sequence to instruct the memory interface control circuit 213 to perform erasing operation on the rewritable non-volatile memory module 220. The write command sequence, the read command sequence and the erase command sequence may respectively include one or more program codes or command codes, and are used for giving instructions to perform corresponding writing, reading and erasing operations on the rewritable non-volatile memory module 220. In one embodiment, the processor 211 may further give other types of command sequence to the memory interface control circuit 213 so as to perform corresponding operations on the rewritable non-volatile memory module 220.

In addition, the data that is to be written into the rewritable non-volatile memory module 220 is converted into a format that can be accepted by the rewritable non-volatile memory module 220 via the memory interface control circuit 213. Specifically, if the processor 211 is to access the rewritable non-volatile memory module 220, the processor 211 transmits a corresponding command sequence to the memory interface control circuit 213 to instruct the memory interface control circuit 213 to perform the corresponding operation. For example, the command sequences may include the write command sequence that instructs to write data, the read command sequence that instructs to read data, the erase command sequence that instructs to erase data and corresponding command sequences for instructing to perform various memory operations (e.g., changing reading voltage set level or executing trash recycle process and the like). The command sequences may include one or more signals or data on a busbar. The signals or data may include a command code or a program code. For example, in the read command sequence, information such as identification code and memory address that are read is included.

The rewritable non-volatile memory module 220 is coupled to the storage controller 210 (memory interface control circuit 213) and stores the data written by the host system 10. The rewritable non-volatile memory module 220 may be other flash memory modules such as a single level cell (SLC) NAND flash memory module (i.e., flash memory module of which one memory cell can store one bit), a multi-level cell (MLC) NAND flash memory module (i.e., flash memory module of which one memory cell can store two bits), a triple level cell (TLC) NAND flash memory module (i.e., flash memory module of which one memory cell can store three bits), a 3D NAND flash memory module or a vertical NAND flash memory module or other memory module that has the same characteristics. The memory cell in the rewritable non-volatile memory module 220 is arranged in a manner of arrays.

In the embodiment, the rewritable non-volatile memory module 220 has a plurality of word lines, and each of the plurality of word lines includes a plurality of memory cells. A plurality of memory cells on a same word line form one or more physical programming units (physical pages). In addition, a plurality of physical programming units may form one physical unit (physical block or physical erase unit). In the embodiment, one physical programming unit may have different types of physical pages. For example, in one embodiment, for a three-level cell NAND flash memory module, one physical programming unit of the three-level cell NAND flash memory module may have a first type physical page and a second type physical page. The first type physical page is, for example, a lower physical page (Lower Physical Page) storing one bit value. The second type physical page is, for example, a middle physical page (Middle Physical Page) and an upper physical page (Upper Physical Page) each storing one bit value. For another example, in one embodiment, for a three-level cell NAND flash memory module, one physical programming unit of the three-level cell NAND flash memory module may have a first type physical page, a second type physical page and a third type physical page. The first type physical page is, for example, a lower physical page storing one bit value. The second type physical page is, for example, a middle physical page storing one bit value. The third type physical page is, for example, an upper physical page storing one bit value. Generally, when data is to be written into upper, middle and lower physical pages of one physical programming unit of a three-level cell NAND flash memory module, sequentially, data is first written into the lower physical page, then written into the middle physical page, and finally written into the upper physical page.

In the embodiment, the physical erase unit is a minimum unit of erasing, that is, each physical erase unit includes the minimum number of memory cells that are erased together. Each physical erase unit has a plurality of physical programming units. One physical erase unit may be formed by any number of physical programming units, depending on the actual needs.

In the following embodiments, one physical block is used as an example of one physical erase unit (also referred to as a physical unit), and each physical programming unit is considered as one physical subunit. In addition, it must be understood that, when the processor 211 groups the physical programming units (or physical units) in the rewritable non-volatile memory module 220 to perform corresponding management operations, the physical programming units (or physical units) are logically grouped without changing actual locations.

For convenience of description, in the following embodiments, one physical programming unit is considered as one storage unit, and in the following embodiments, an empty unit identification operation (also referred to as an empty storage unit identification operation) for a physical programming unit and a memory management method used by the physical programming unit are described.

The storage controller 210 configures a plurality of logical units for the rewritable non-volatile memory module 220. The host system 10 accesses, via the configured logical units, user data stored in the plurality of physical units. Herein, each logical unit may be formed by one or more logical addresses. For example, the logical unit may be a logical block (Logical Block), a logical page (Logical Page) or a logical sector (Logical Sector). In the embodiment, the logical unit is a logical block, and the logical subunit is a logical page. Each logical unit has a plurality of logical subunits. One logical unit may be mapped to one physical unit, and one logical subunit may be mapped to one physical subunit.

In addition, the storage controller 210 may create a logical to physical address mapping table (Logical To Physical address mapping table) and a physical to logical address mapping table (Physical To Logical address mapping table), to record a mapping relationship between the logical units (e.g., logical blocks, logical pages or logical sectors) configured for the rewritable non-volatile memory module 220 and the physical units (e.g., physical erase units, physical programming units, and physical sectors). In other words, the storage controller 210 may search for a physical unit mapped to a logical unit via the logical to physical address mapping table, and the storage controller 210 may search for a logical unit mapped to a physical unit via the physical to logical address mapping table. However, the foregoing technical concepts related to the mapping between the logical units and the physical units are common technical means of the persons skilled in the art, and the descriptions thereof are omitted herein.

In the embodiment, an error detecting and correcting circuit 214 is coupled to the processor 211, and is configured to perform an error detecting and correcting process, to ensure data correctness. Specifically, when the processor 211 receives a write instruction from the host system 10, the error detecting and correcting circuit 214 generates a corresponding error correcting code (error correcting code, ECC) and/or error detecting code (error detecting code, EDC) for data corresponding to the write instruction. The processor 211 writes the data corresponding to the write instruction and the corresponding error correcting code and/or error detecting code into the rewritable non-volatile memory module 220. Then, when reading data from the rewritable non-volatile memory module 220, the processor 211 also reads the error correcting code and/or error detecting code corresponding to the data. The error detecting and correcting circuit 214 performs the error detecting and correcting process on the read data according to the error correcting code and/or error detecting code. In addition, after the error detecting and correcting process, if the read data is successfully decoded, the error detecting and correcting circuit 214 may return an error bit value (also referred to as an error bit number) to the processor 211.

In one embodiment, the storage controller 210 further includes a cache memory 216 and a power management circuit 217. The cache memory is coupled to the processor 211 and is configured to temporarily store data and an instruction from the host system 10, the data from the rewritable non-volatile memory module 220 or other system data used for managing the storage device 20, so that the processor 211 can quickly access the data, instruction or system data from the cache memory 216. The power management circuit 217 is coupled to the processor 211 and is configured to control a power supply of the storage device 20.

In the embodiment, the empty unit management circuit module 215 includes a Gray code counting circuit 2151 and an empty unit determining circuit 2152. The empty unit management circuit module 215 is a circuit module (hardware) configured to execute the empty unit identification operation. An operation performed by each component of the empty unit management circuit module 215 may also be considered as an operation performed by the empty unit management circuit module 215. The empty unit management circuit module 215 may further be configured to record information about an empty unit, for example, information about locations and a total capacity of all empty storage units.

Details about how the empty unit management circuit module 215 performs an empty unit identification operation and functions of the Gray code counting circuit 2151 and the empty unit determining circuit 2152 will be illustrated below with a plurality of accompanying drawings.

Figure 2:
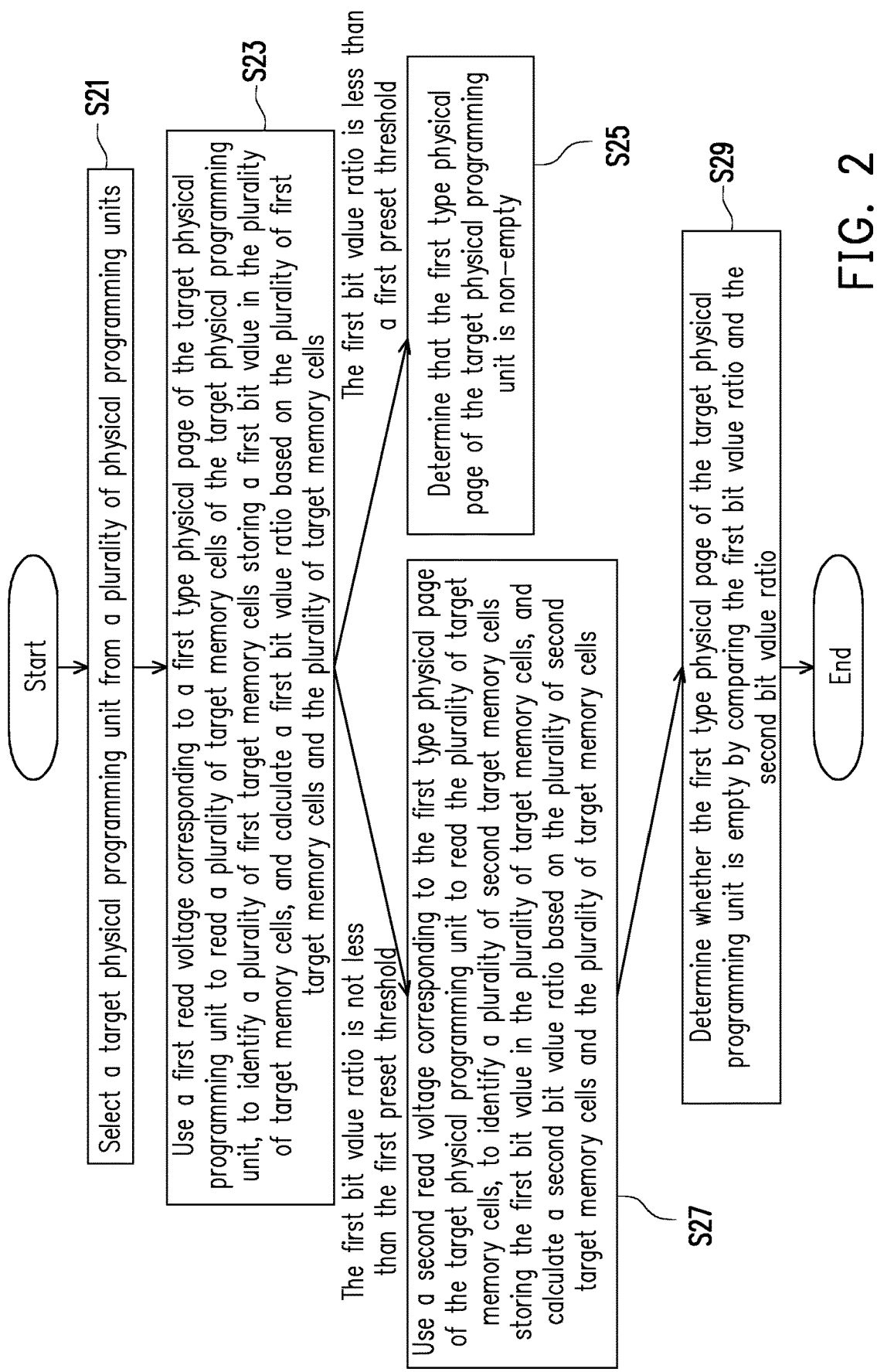
FIG. 2 is a flowchart of a memory management method according to one embodiment of the invention.

FIG. 2 is a flowchart of a memory management method according to one embodiment of the invention. It should be noted that the memory management method shown in FIG. 2 may also be referred to as an empty unit identification method. Referring to both FIG. 1 and FIG. 2, in step S21, the processor 211 selects a target physical programming unit from a plurality of physical programming units of the rewritable non-volatile memory module.

Specifically, the processor 211 may select one physical programming unit (also referred to as the target physical programming unit) from the plurality of physical programming units of the rewritable non-volatile memory module 220 at a particular time point, and instruct the empty unit management circuit module 215 to perform an empty unit identification operation on the target physical programming unit. For example, the particular time point includes: (1) when the storage device 20 is idle (that is, when the storage device 20 is idle for a preset time threshold); (2) during power-up of the storage device; or (3) when a restoration operation corresponding to a sudden power-off event is performed.

The processor 211 (or the empty unit management circuit module 215) may perform an empty unit identification operation on each of a plurality of physical programming units that are not yet confirmed to be empty. The physical programming unit that is selected for the empty unit identification operation is the target physical programming unit. In another embodiment, the processor 211 (or the empty unit management circuit module 215) may select different physical programming units from all physical programming units of the rewritable non-volatile memory module 220 as target physical programming units to perform an empty unit identification operation.

In addition, alternatively, the processor 211 (or the empty unit management circuit module 215) may directly perform an empty unit identification operation on all physical programming units with open physical units (that is, physical units that are currently used for storing written data).

After the target physical programming unit is selected, step S23 is performed. The empty unit management circuit module 215 uses a first read voltage corresponding to a first type physical page of the target physical programming unit to read a plurality of target memory cells of the target physical programming unit, to identify a plurality of first target memory cells storing a first bit value in the plurality of target memory cells, and calculates a first bit value ratio based on the plurality of first target memory cells and the plurality of target memory cells.

Specifically, the target physical programming unit is formed by a plurality of memory cells (also referred to as target memory cells). Each memory cell is configured to be programmed to store a bit value corresponding to one of a plurality of different Gray codes (also referred to as storage states), and the total number of the Gray codes is N, where N is a first preset positive integer greater than 2. For rewritable non-volatile memory modules 220 corresponding to different types of NAND flash memories, N may have different values. For example, if the rewritable non-volatile memory module 220 is a single-level cell NAND flash memory module, N is equal to 2, if the rewritable non-volatile memory module 220 is a multi-level cell NAND flash memory module, N is equal to 4, if the rewritable non-volatile memory module 220 is a three-level cell NAND flash memory module, N is equal to 8, if the rewritable non-volatile memory module 220 is a four-level cell NAND flash memory module, N is equal to 16, and so on. In other words, the value of N is determined depending on a type of the rewritable non-volatile memory module 220.

Figure 3A:
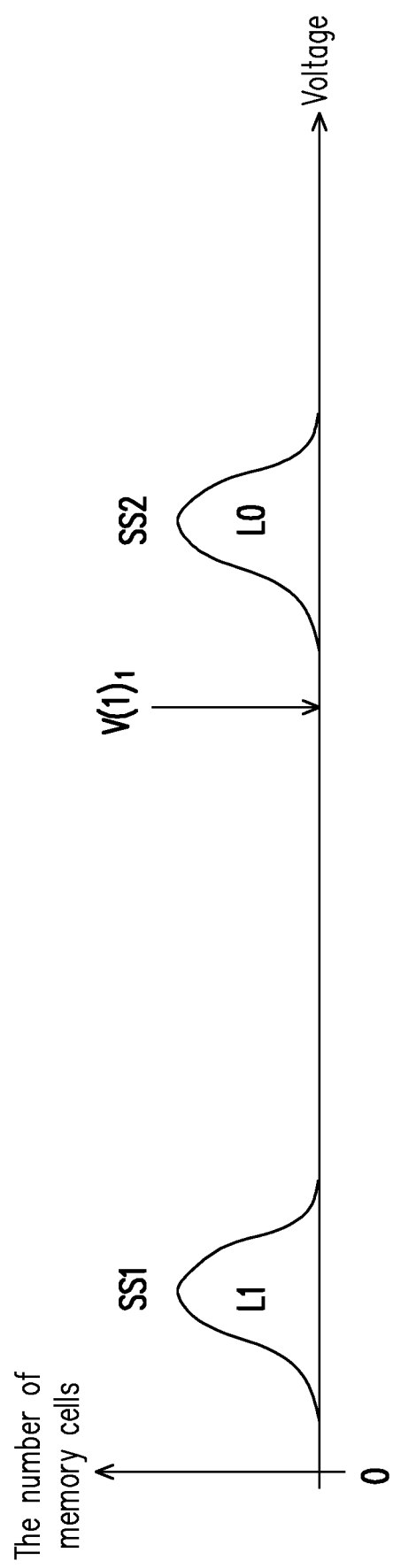
FIG. 3A is a schematic diagram of a threshold voltage distribution and corresponding read voltages of a plurality of memory cells of a single-level cell (SLC) NAND flash memory module according to one embodiment of the invention.
Figure 4A:
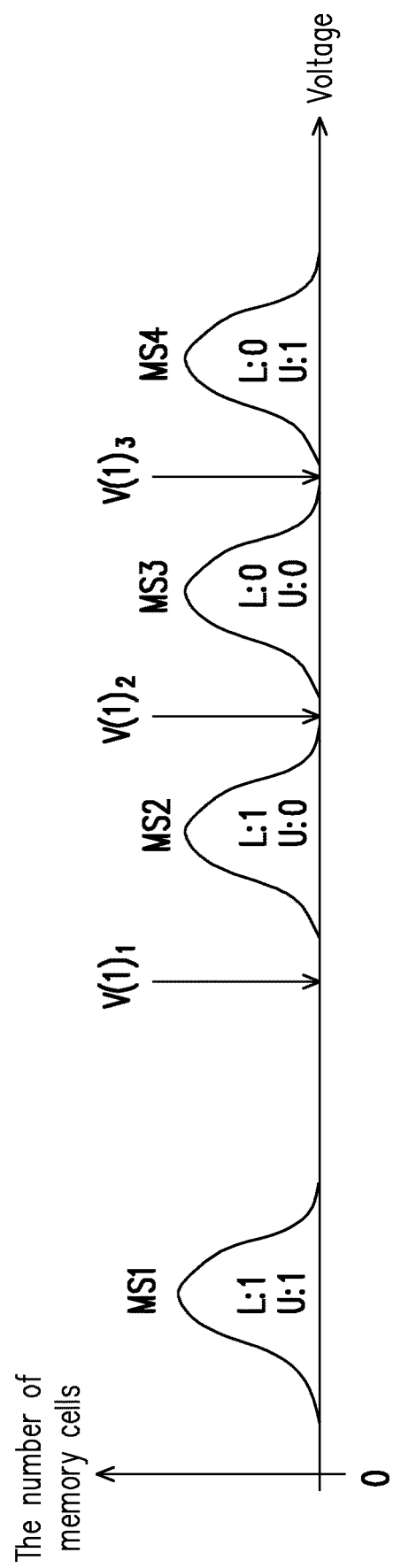
FIG. 4A is a schematic diagram of a threshold voltage distribution and corresponding read voltages of a plurality of memory cells of a multi-level cell (MLC) NAND flash memory module according to one embodiment of the invention.
Figure 5:
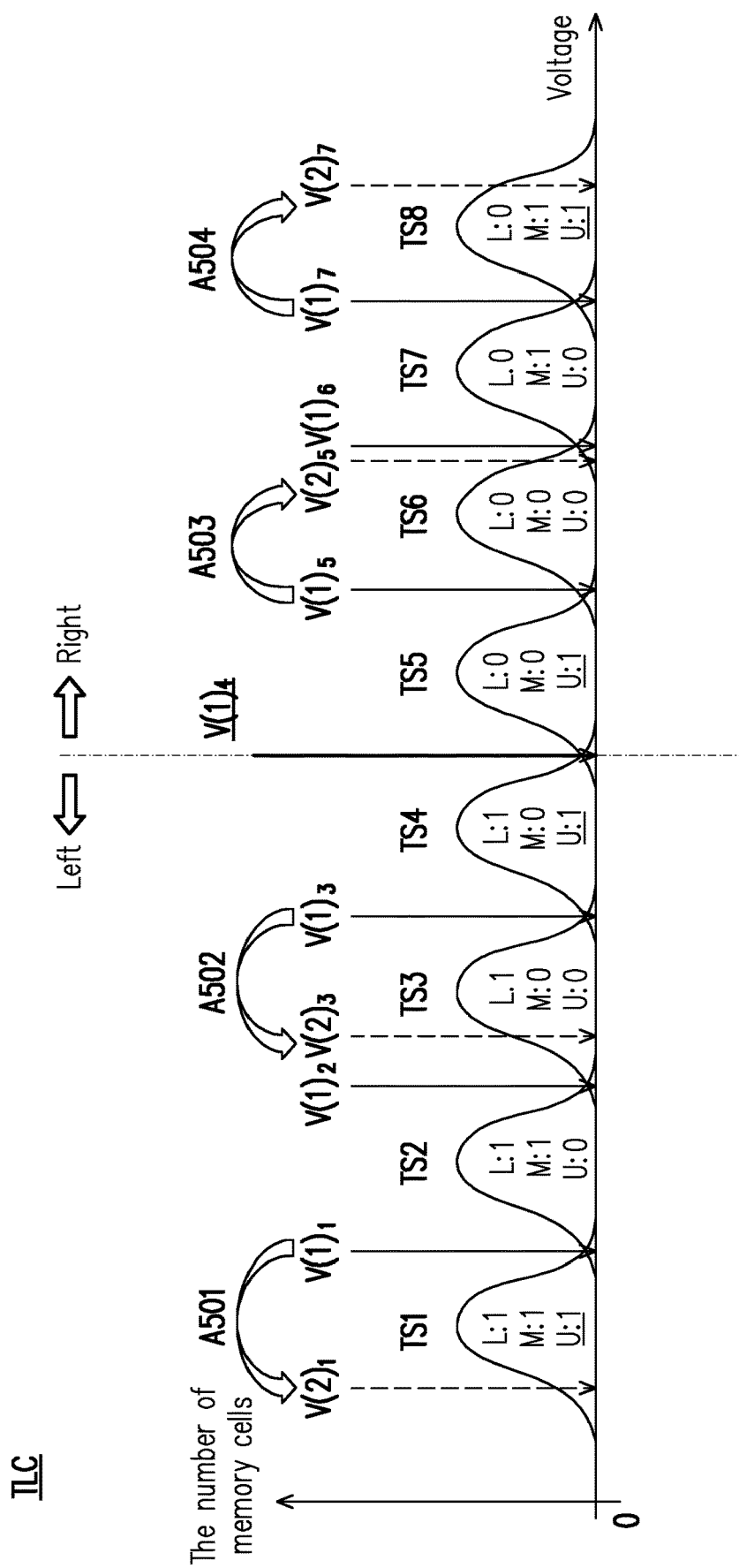
FIG. 5 is a schematic diagram of a threshold voltage distribution and a corresponding empty unit identification operation of a plurality of memory cells of a three-level cell (TLC) NAND flash memory module according to one embodiment of the invention.

FIG. 3A is a schematic diagram of a threshold voltage distribution and corresponding read voltages of a plurality of memory cells of a single-level cell (SLC) NAND flash memory module according to one embodiment of the invention. FIG. 4A is a schematic diagram of a threshold voltage distribution and corresponding read voltages of a plurality of memory cells of a multi-level cell (MLC) NAND flash memory module according to one embodiment of the invention. FIG. 5 is a schematic diagram of a threshold voltage distribution and a corresponding empty unit identification operation of a plurality of memory cells of a three-level cell (TLC) NAND flash memory module according to one embodiment of the invention.

Referring to FIG. 3A, the single-level cell NAND flash memory module (SLC for short) may have two storage states (Gray codes), for example, a bit value "1" and a bit value "0". In addition, the processor 211 (or the empty unit management circuit module 215) may use a read voltage $V(1)_1$ corresponding to two storage states to read a target physical programming unit of the SLC (that is, use the read voltage $V(1)_1$ to read one of a plurality of physical programming units of the rewritable non-volatile memory module 220 of the SLC), to identify storage states of a plurality of target memory cells of the target physical programming unit (that is, to identify bit values written into the plurality of target memory cells). In other words, a plurality of memory cells programmed into the bit value "1" ("L:1" marked in FIG. 3A) in the SLC has a threshold voltage distribution SS1, which is less than the read voltage $V(1)_1$. A plurality of memory cells programmed into the bit value "0" (that is, "L:0") in the SLC has a threshold voltage distribution SS2, which is greater than the read voltage $V(1)_1$. The read voltage $V(1)_1$ may be a preset read voltage corresponding to the target physical programming unit, or an optimum read voltage corresponding to the target physical programming unit. This embodiment is not limited to the read voltage that is originally used for reading the target physical programming unit.

Figure 3B:
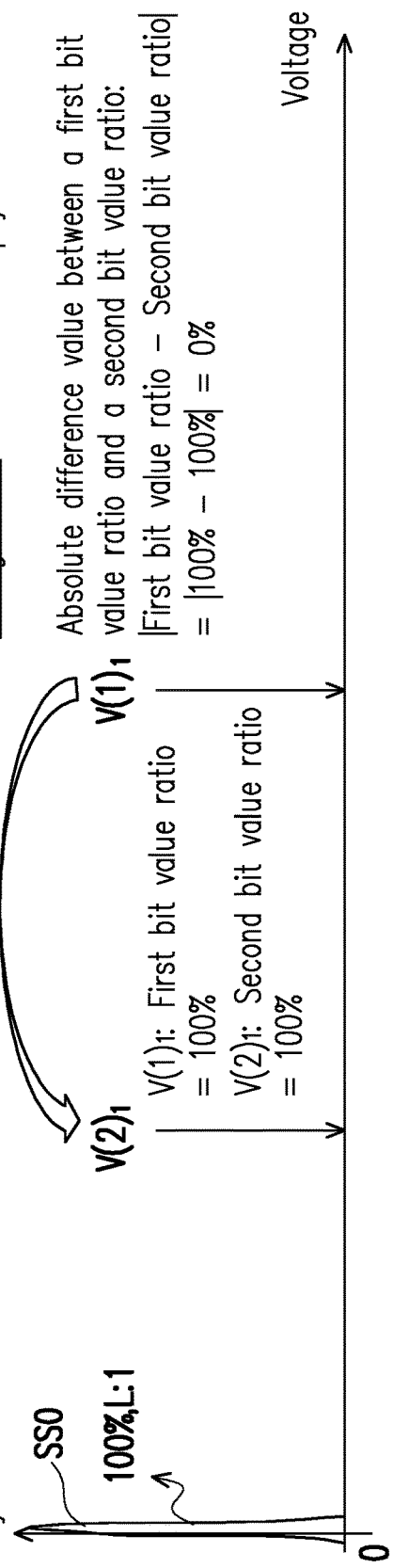
FIG. 3B is a schematic diagram of an empty unit identification operation for a single-level cell NAND flash memory module according to one embodiment of the invention.
Figure 3B:
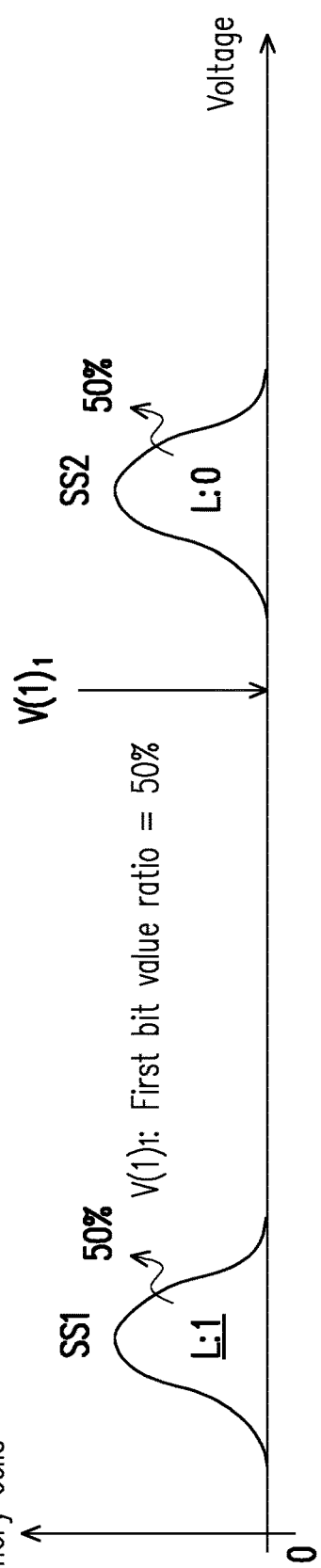

FIG. 3B is a schematic diagram of an empty unit identification operation for a single-level cell NAND flash memory module according to one embodiment of the invention.

Referring to FIG. 3B, if data in the target physical programming unit of the SLC has not been programmed (that is, a storage state of the target physical programming unit is erased or empty), all target memory cells of the target physical programming unit have a threshold voltage distribution SS0 near a voltage 0 volt, and all the target memory cells have a storage state of "1". To be specific, in the target physical programming unit, the total number of target memory cells whose storage states are "1" occupies 100% of the total number of all the target memory cells of the target physical programming unit (for example, the example of an upper part of FIG. 3B). That is, in the target physical programming unit, the total number of target memory cells whose storage states are "1" occupies 100% of the total number of all the target memory cells of the target physical programming unit. That is, all the target memory cells have a storage state of "1". A ratio obtained through dividing the total number of target memory cells whose storage states are "1" that are read via the read voltage $V(1)_1$ (also referred to as a first read voltage $V(1)_1$) by the total number of all the target memory cells may also be referred to as a bit value ratio (a bit value ratio corresponding to the first read voltage may be referred to as a first bit value ratio). The bit value ratio is used for indicating a ratio of target memory cells whose storage states are identified as "1" to all the target memory cells of the target physical programming unit after the target physical programming unit is read via the read voltage. With the foregoing definition, it can be learned that the first bit value ratio of the physical programming unit that is of the SLC and whose storage state is erased or empty is equal to 100%. Because of this phenomenon, in a conventional method, if the first bit value ratio calculated by using the first read voltage is 100%, the empty unit management circuit module 215 (for example, the empty unit determining circuit 2152) directly determines that the physical programming unit is empty. 100% may also be referred to as a preset value. However, the empty unit identification operation in the invention does not determine whether the physical programming unit is empty according to only this rule. In the following descriptions corresponding to FIG. 3C and FIG. 4E, disadvantages of the conventional method and improvements of the invention will further be illustrated.

If the data in the target physical programming unit of the SLC has been programmed (that is, the storage state of the target physical programming unit is non-empty), the plurality of target memory cells of the target physical programming unit are evenly programmed to have storage states of "1" and "0" (each having a proportion of approximately 50%). In the target physical programming unit, the total number of target memory cells whose storage states are "1" occupies 50% of the total number of all the target memory cells of the target physical programming unit (for example, the example of a lower part of FIG. 3B). In addition, in the target physical programming unit, the total number of target memory cells whose storage states are "0" also occupies 50% of the total number of all the target memory cells of the target physical programming unit. In this example, the first bit value ratio of the physical programming unit that is of the SLC and whose storage state is non-empty is equal to 50%.

In the embodiment, the Gray code counting circuit 2151 of the empty unit management circuit module 215 may be configured to calculate the total number of memory cells having a storage state corresponding to each read voltage (that is, statistics about the total number of different types of read bit values/storage states are collected). The Gray code counting circuit 2151 of the empty unit management circuit module 215 may further be configured to calculate a bit value ratio corresponding to each read voltage.

Referring to FIG. 4A, compared with the SLC, a physical programming unit of the multi-level cell NAND flash memory module (MLC for short) may have a lower physical page (which may be marked as "L") (also referred to as a first type physical page) and an upper physical page (which may be marked as "U") (also referred to as a second type physical page). The upper physical page and the lower physical page each may store two types of storage states (that is, "1" and "0"). Therefore, the MLC may have a total of four storage states (Gray codes), for example, a bit value "11" ("L:1 U:1" shown in FIG. 4A, that is, a storage state of the lower physical page is "1" and a storage state of the upper physical page is "1"), a bit value "10" ("L:1 U:0" shown in FIG. 4A, that is, a storage state of the lower physical page is "1" and a storage state of the upper physical page is "0"), a bit value "00" ("L:0 U:0" shown in FIG. 4A, that is, a storage state of the lower physical page is "0" and a storage state of the upper physical page is "0"), and a bit value "01" ("L:0 U:1" shown in FIG. 4A, that is, a storage state of the lower physical page is "0" and a storage state of the upper physical page is "1"). In addition, the processor 211 (or the empty unit management circuit module 215) may use read voltages $V(1)_1$ to $V(1)_3$ corresponding to four storage states to read a target physical programming unit of the MLC, to identify storage states/a threshold voltage distribution of a plurality of target memory cells of the target physical programming unit. The read voltage $V(1)_1$ to $V(1)_3$ may be preset read voltages corresponding to the target physical programming unit of the MLC, or optimum read voltages corresponding to the target physical programming unit of the MLC. This embodiment is not limited to the read voltage that is originally used for reading the target physical programming unit. It should be noted that the MLC has the first type physical page and the second type physical page, but the SLC has only the first type physical page.

For example, the read voltage $V(1)_2$ is used for identifying/distinguishing a storage state of a memory cell of the lower physical page. For example, a memory cell that is of the lower physical page and whose threshold voltage distribution is less than the read voltage $V(1)_2$ has a storage state of "1" ("L:1" shown in FIG. 4A), for example, threshold voltage distributions MS1 and MS2. A memory cell that is of the lower physical page and whose threshold voltage distribution is greater than the read voltage $V(1)_2$ has a storage state of "0" ("L:0" shown in FIG. 4A), for example, threshold voltage distributions MS3 and MS4. For example, the read voltages $V(1)_1$ and $V(1)_3$ are used for identifying/distinguishing a storage state of a memory cell of the upper physical page. For example, a memory cell that is of the upper physical page and whose threshold voltage distribution is less than the read voltage $V(1)_1$ has a storage state of "1" ("U:1" shown in FIG. 4A), for example, a threshold voltage distribution MS1. A memory cell that is of the upper physical page and whose threshold voltage distribution is greater than the read voltage $V(1)_3$ has a storage state of "1" ("U:1" shown in FIG. 4A), for example, a threshold voltage distribution MS4. A memory cell that is of the upper physical page and whose threshold voltage distribution is between the read voltages $V(1)_1$ and $V(1)_3$ has a storage state of "0" ("U:0" shown in FIG. 4A), for example, threshold voltage distributions MS2 and MS3. In other words, the read voltage $V(1)_1$ to $V(1)_3$ may be used for identifying that a memory cell with a threshold voltage distribution MS1 has a storage state indicating a bit value of "11", a memory cell with a threshold voltage distribution MS2 has a storage state indicating a bit value of "10", a memory cell with a threshold voltage distribution MS3 has a storage state indicating a bit value of "00", and a memory cell with a threshold voltage distribution MS4 has a storage state indicating a bit value of "01".

It should be noted that, if data in the target physical programming unit of the MLC is not programmed (that is, a storage state of the target physical programming unit is erased or empty), same as the foregoing example of the SLC, all target memory cells of the target physical programming unit have a threshold voltage distribution near a voltage 0 volt, and all the target memory cells have a storage state of "1". In this storage state, the target physical programming unit has a bit value ratio of 100%. In addition, if a storage state of a physical programming unit of a TLC/QLC is also erased or empty, the physical programming unit of the TLC/QLC has a bit value ratio of 100%.

Referring to FIG. 5, similar to the SLC and the MLC, a physical programming unit of a three-level cell NAND flash memory module (TLC for short) may have a lower physical page (which may be marked as "L") (also referred to as a first type physical page), a middle physical page (which may be marked as "M") and an upper physical page (which may be marked as "U") (the middle physical page and the upper physical page may be referred to as a second type physical page). The upper, middle and lower physical pages each may store two storage states (that is, "1" and "0"), so that the physical programming unit of the TLC may store eight storage states (a storage state combination of the upper, middle and lower physical pages as shown in FIG. 5: "111", "110", "100", "101", "001", "000", "010", and "011"). A read voltage $V(1)_4$ is used for identifying/distinguishing a storage state of the lower physical page. A read voltage $V(1)_2$ and a read voltage $V(1)_6$ are used for identifying/distinguishing a storage state of the middle physical page. A read voltage $V(1)_1$, a read voltage $V(1)_3$, a read voltage $V(1)_5$, and a read voltage $V(1)_7$ are used for identifying/distinguishing a storage state of the upper physical page.

Calculation of a bit value ratio is first described below by using the multi-level cell NAND flash memory module as an example.

FIG. 4B to FIG. 4E are schematic diagrams of an empty unit identification operation for a multi-level cell NAND flash memory module according to one embodiment of the invention.

Figure 4B:
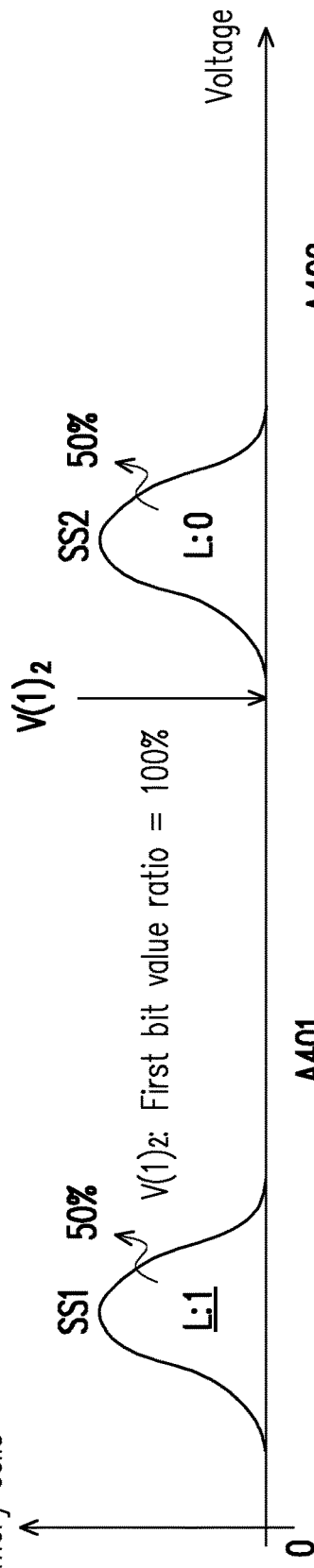
FIG. 4B to FIG. 4E are schematic diagrams of an empty unit identification operation for a multi-level cell NAND flash memory module according to one embodiment of the invention.
Figure 4B:
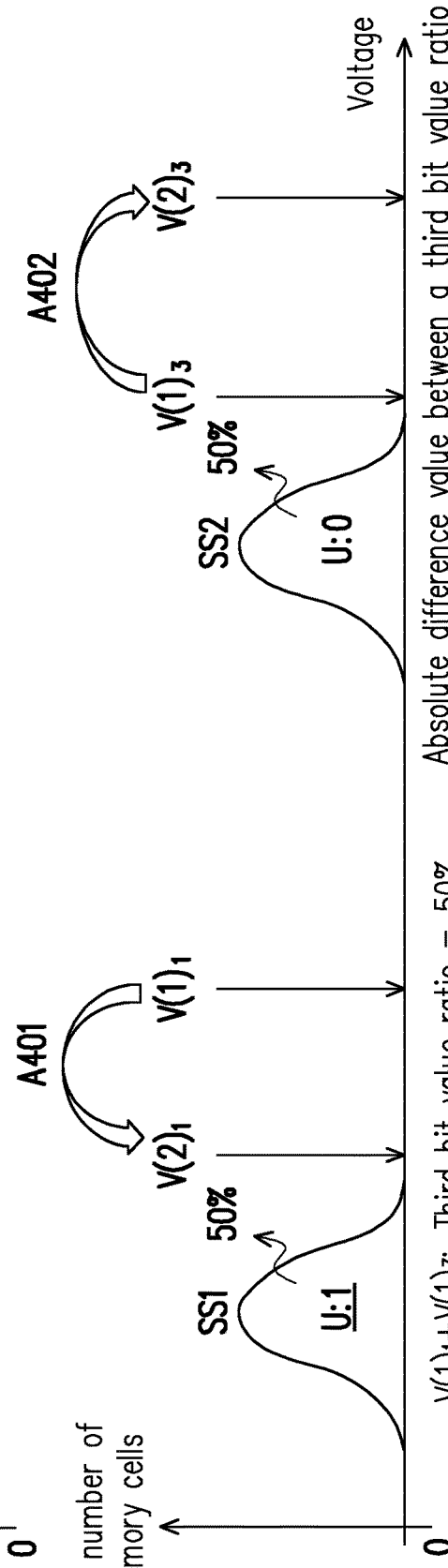

Referring to an upper part of FIG. 4B, it is assumed that data in a target physical programming unit of the MLC is programmed (that is, a storage state of the target physical programming unit is non-empty) only into a lower physical page (a first type physical page), that is, the target physical programming unit has a first type storage state (the first type physical page is non-empty and a second type physical page is empty). A plurality of target memory cells of the lower physical page of the target physical programming unit is evenly programmed to have storage states "1" and "0" (each having a proportion of approximately 50%). That is, target memory cells with the storage state "1" occupy 50% of all the target memory cells. In this example (the upper part of FIG. 4B), the Gray code counting circuit 2151 uses a first read voltage $V(1)_2$ corresponding to the lower physical page to read a target physical programming unit of the MLC having the first type storage state, to calculate a first bit value ratio (50%).

Figure 4C:
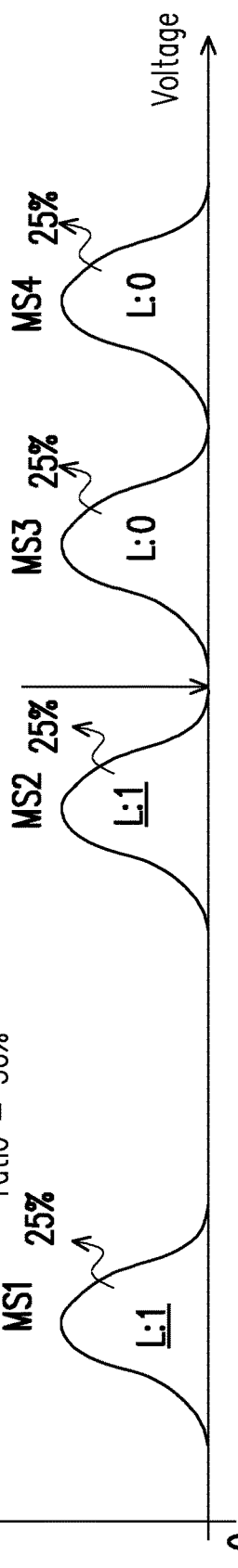
Figure 4C:
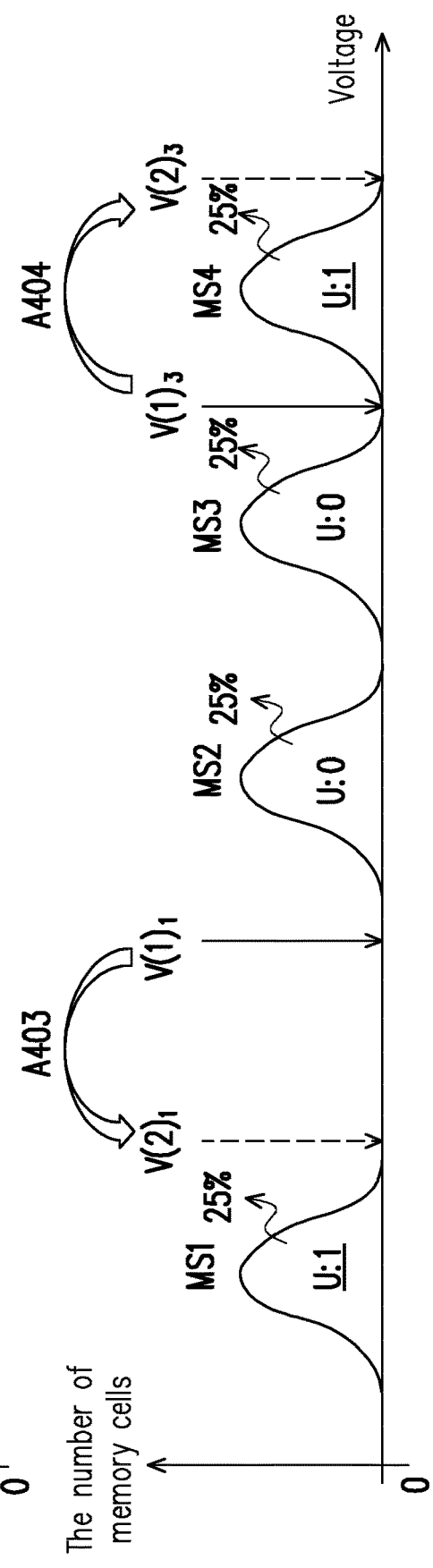

For another example, referring to an upper part of FIG. 4C, it is assumed that data in a target physical programming unit of the MLC is programmed (that is, a storage state of the target physical programming unit is non-empty) into a lower physical page (a first type physical page) and an upper physical page (a second type physical page), that is, the target physical programming unit has a second type storage state (the first type physical page is non-empty and the second type physical page is non-empty). In the embodiment, the Gray code counting circuit 2151 uses a first read voltage $V(1)_2$ (a read voltage $V(1)_2$ used for identifying/distinguishing a storage state of a memory cell of the lower physical page) of the lower physical page to read the target physical programming unit (refer to the foregoing example in FIG. 4B), to identify a plurality of first target memory cells storing the bit value "1" (that is, the first bit value) in the plurality of target memory cells of the target physical programming unit. The Gray code counting circuit 2151 calculates the first bit value ratio based on the plurality of first target memory cells and the plurality of target memory cells, that is, uses a ratio calculated through dividing the total number of the plurality of first target memory cells by the total number of the plurality of target memory cells as the first bit value ratio. In the foregoing example, the calculated first bit value ratio is 50%, which includes 25% occupied by a plurality of memory cells with the threshold voltage distribution MS1 and 25% occupied by a plurality of memory cells with the threshold voltage distribution MS2 (a memory cell having a threshold voltage less than the read voltage $V(1)_2$ is determined to have a storage state of "1").

In the embodiment, a method for determining whether the first type physical page is empty is: The empty unit determining circuit 2152 determines whether a first bit value ratio corresponding to the first type physical page is less than a preset threshold (also referred to as a first preset threshold), to determine whether a first type physical page of a physical programming unit corresponding to the first bit value ratio is empty.

Specifically, after the first bit value ratio is calculated (S23), if the first bit value ratio is less than the first preset threshold, step S25 is performed. The empty unit determining circuit 2152 directly determines that the first type physical page of the target physical programming unit is non-empty.

For example, it is assumed that the preset threshold is 90%, and a bit value ratio obtained by using the read voltage corresponding to the first type physical page is 50%. In this case, the empty unit determining circuit 2152 directly determines that the first type physical page corresponding to the bit value ratio is non-empty (which may also be referred to as non-empty or programmed). For example, the example of the lower part of FIG. 3B, the example of the upper part of FIG. 4B, and the example of the upper part of FIG. 4C all belong to this case.

A manufacture may design a value, for example, 90%, of the first preset threshold according to a need and a physical characteristic of the rewritable non-volatile memory module 220. However, a specific value of the first preset threshold is not limited in the invention, and the first preset threshold may be another value different from 90%.

In addition, after the first bit value ratio is calculated (S23), if the first bit value ratio is not less than the first preset threshold, step S27 is performed. The Gray code counting circuit 2151 uses a second read voltage corresponding to the first type physical page of the target physical programming unit to read the plurality of target memory cells, to identify a plurality of second target memory cells storing the first bit value in the plurality of target memory cells, and calculates a second bit value ratio based on the plurality of second target memory cells and the plurality of target memory cells.

Herein, details about the second read voltage are described. Specifically, in the operation of step S27, the Gray code counting circuit 2151 uses the second read voltage that is different from the first read voltage to read the first type physical page of the target physical programming unit. The second read voltage is also a read voltage used for identifying a storage state of a memory cell having the first type physical page, and a voltage value of the second read voltage may be obtained by adding a "negative" offset voltage (which may also be considered as the voltage value of the second read voltage may be obtained by subtracting a "positive" offset voltage from the first read voltage). Generally, the first read voltage may be obtained by using a voltage adjustment instruction to instruct to use one of a plurality of offset voltages (which may be negative or positive) to adjust a voltage value of the first read voltage. In the embodiment, the second read voltage in step S27 may be obtained by using a voltage adjustment instruction to adjust the first read voltage to the leftmost (an arrow A302 shown in an upper part of FIG. 3C), so that the first read voltage $V(1)_1$ is adjusted to be the second read voltage $V(2)_1$ (for example, adding a minimum negative offset voltage to the first read voltage). In another embodiment, the second read voltage may be predetermined, that is, not be adjusted via the first read voltage.

In the embodiment, a difference between step 27 and step 23 lies in that: in step S27, the second read voltage is used for reading the first type physical page of the target physical programming unit, to calculate the second bit value ratio corresponding to the second read voltage. Like the method described in step S23, for example, referring to the example of a lower part of FIG. 3C, it is assumed that the first preset threshold is 90%, and the first bit value ratio corresponding to the first read voltage $V(1)_1$ is 100%. The Gray code counting circuit 2151 uses the second read voltage $V(2)_1$ corresponding to the first type physical page to read the target physical programming unit, to identify the plurality of first target memory cells storing the bit value "1" (that is, the first bit value) in the plurality of target memory cells of the target physical programming unit.

After the second bit value ratio is obtained, step S29 is performed. The empty unit determining circuit 2152 determines whether the first type physical page of the target physical programming unit is empty by comparing the first bit value ratio and the second bit value ratio.

That is, if the first bit value ratio is not less than the first preset threshold, the empty unit determining circuit 2152 does not directly determine that the first type physical page corresponding to the target physical programming unit is non-empty, and does not directly determine that the first type physical page corresponding to the first bit value ratio is empty. The empty unit determining circuit 2152 needs to determine whether the corresponding first type physical page is empty based on the first bit value ratio and the second bit value ratio after obtaining the second bit value ratio.

More specifically, in the operation of "determining whether the first type physical page of the target physical programming unit is empty by comparing the first bit value ratio and the second bit value ratio", the empty unit determining circuit 2152 determines that the first type physical page of the target physical programming unit is non-empty if an absolute difference value between the first bit value ratio and the second bit value ratio is greater than a second preset threshold. On the contrary, the empty unit determining circuit 2152 determines that the first-type physical page of the target physical programming unit is empty if the absolute difference value between the first bit value ratio and the second bit value ratio is not greater than the second preset threshold. A manufacture may design a value, for example, 15%, of the second preset threshold according to a need and a physical characteristic of the rewritable non-volatile memory module 220. However, a specific value of the second preset threshold is not limited in the invention, and the second preset threshold may be another value different from 15%. For example, a value range of the second preset threshold is 10% to 20%.

For example, referring to the example of the upper part of FIG. 3B, it is assumed that the first preset threshold is 90%, the second preset threshold is 15%, and the obtained first bit value ratio corresponding to the first read voltage $V(1)_1$ is 100%. Because the first bit value ratio is less than the first preset threshold, the Gray code counting circuit 2151 adjusts the first read voltage $V(1)_1$ to be the second read voltage $V(2)_1$ (shown by the arrow A301), and uses the second read voltage $V(2)_1$ to read the target physical programming unit, to calculate the second bit value ratio. A value of the second bit value ratio is 100%. Next, the empty unit determining circuit 2152 calculates the absolute difference value (that is, an absolute value of a difference) between the first bit value ratio and the second bit value ratio, and the calculated result is 0%. Because the absolute difference value between the first bit value ratio and the second bit value ratio is not greater than the second preset threshold, the empty unit determining circuit 2152 determines that the first-type physical page of the target physical programming unit is empty. In one embodiment, when the first bit value ratio is equal to the second bit value ratio, the empty unit determining circuit 2152 also directly determines that the corresponding physical page is empty.

Figure 3C:
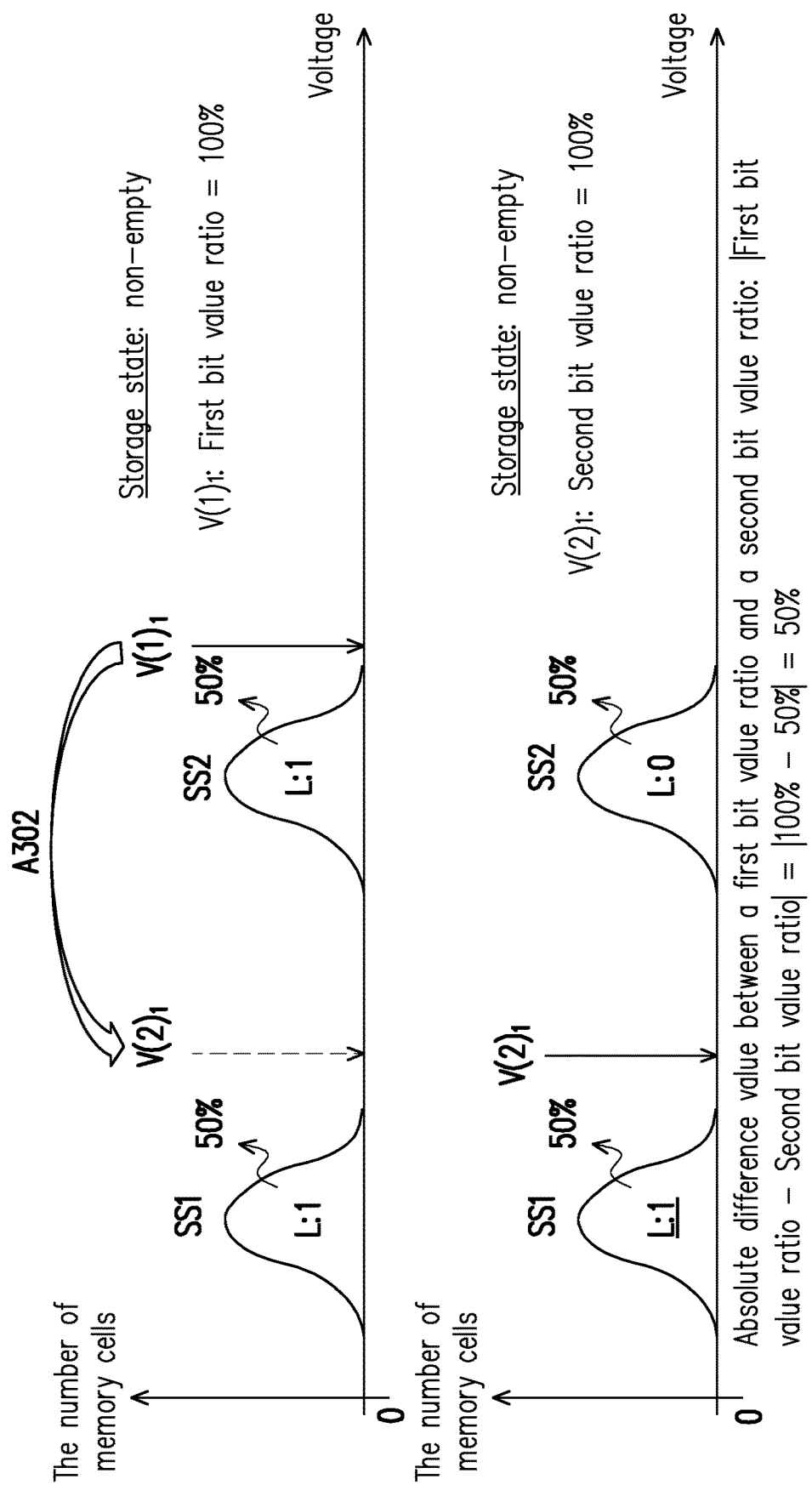
FIG. 3C is a schematic diagram of an empty unit identification operation for a single-level cell NAND flash memory module according to one embodiment of the invention.

The spirit of the empty unit identification method provided in the invention is that: Two different read voltages are separately used for reading a same physical programming unit (the two read voltages are used for identifying a storage state of a physical page of the physical programming unit), to obtain two corresponding bit value ratios, thereby determining whether the physical page of the physical programming unit is empty by comparing the two bit value ratios respectively corresponding to the different read voltages. Beneficial effects of the method are as follows: When a threshold voltage distribution of a physical programming unit which data has been written into (programmed) has an abnormal offset, the empty unit identification method provided in the invention may avoid erroneous determining of an empty unit. FIG. 3C is used as an example for description first.

FIG. 3C is a schematic diagram of an empty unit identification operation for a single-level cell NAND flash memory module according to one embodiment of the invention.

Referring to FIG. 3C, it is assumed that the rewritable non-volatile memory module 220 is an SLC, data has been written into a target physical programming unit and a threshold voltage distribution of a plurality of target memory cells into which the data has been written has an abnormal offset. In this example, because the threshold voltage distribution has the abnormal offset, a first bit value ratio obtained by reading the target physical programming unit by using a first read voltage $V(1)_1$ is 100%. This is different from the first bit value ratio (50%) in the example (the normal threshold voltage distribution of the memory cells into which data has been written) of the lower part of FIG. 3B, but is the same as the first bit value ratio (100%) in the example (empty or erased, that is, no data has been written) of the upper part of FIG. 3B. In other words, if it's purely like the conventional method: "whether the corresponding physical page is empty is determined only by determining whether the first bit value ratio obtained using the first read voltage is approximately/equal to 100% (or greater than a particular threshold)", the conventional method will cause a physical page of the physical programming unit having an abnormal threshold voltage distribution to be determined as empty (although the physical programming unit actually is non-empty). Consequently, an empty unit identification result is erroneous.

However, according to the empty unit identification operation/method provided in the embodiment, when the first bit value ratio (100%) corresponding to the first read voltage $V(1)_1$ is not less than a first preset threshold (for example, 90%), the empty unit management circuit module 215 uses a second read voltage $V(2)_1$ (shown by the arrow A302) to read the physical programming unit, to obtain a second bit value ratio (50%) (for example, the example of the lower part of FIG. 3C). The empty unit management circuit module 215 further calculates an absolute difference value between the first bit value ratio and the second bit value ratio. In this example, it is assumed that a second preset threshold is 15%. The calculated absolute difference value is 50%, which is greater than the second preset threshold. Therefore, the empty unit management circuit module 215 determines that the physical page of the physical programming unit is non-empty. In this way, when the threshold voltage distribution of the plurality of memory cells of the physical page of the physical programming unit has an abnormal offset, the empty unit identification operation/method provided in the embodiment still can effectively and precisely determine whether the physical page is empty, thereby avoiding an erroneous empty unit identification result caused by the conventional method.

In addition to the SLC shown in FIG. 3C, similarly, memory cells of a physical programming unit of an MLC/TLC/QLC with a threshold voltage distribution having an abnormal offset also can apply the empty unit identification operation/method provided in the embodiment to effectively and precisely determine an empty unit identification result. The MLC is then used as an example for description below.

Figure 4D:
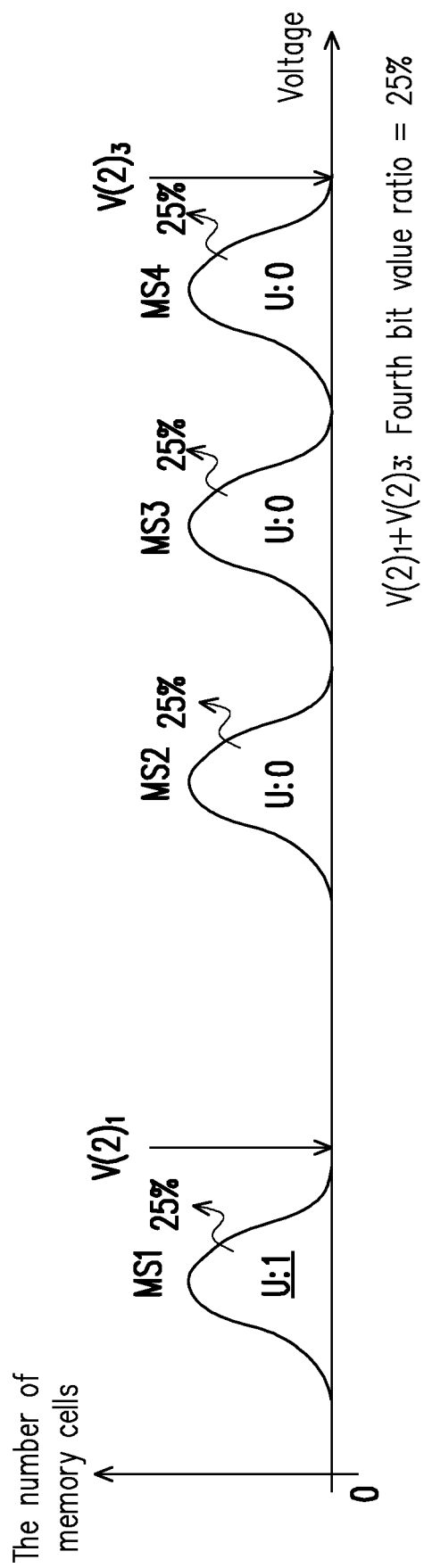
Figure 4E:
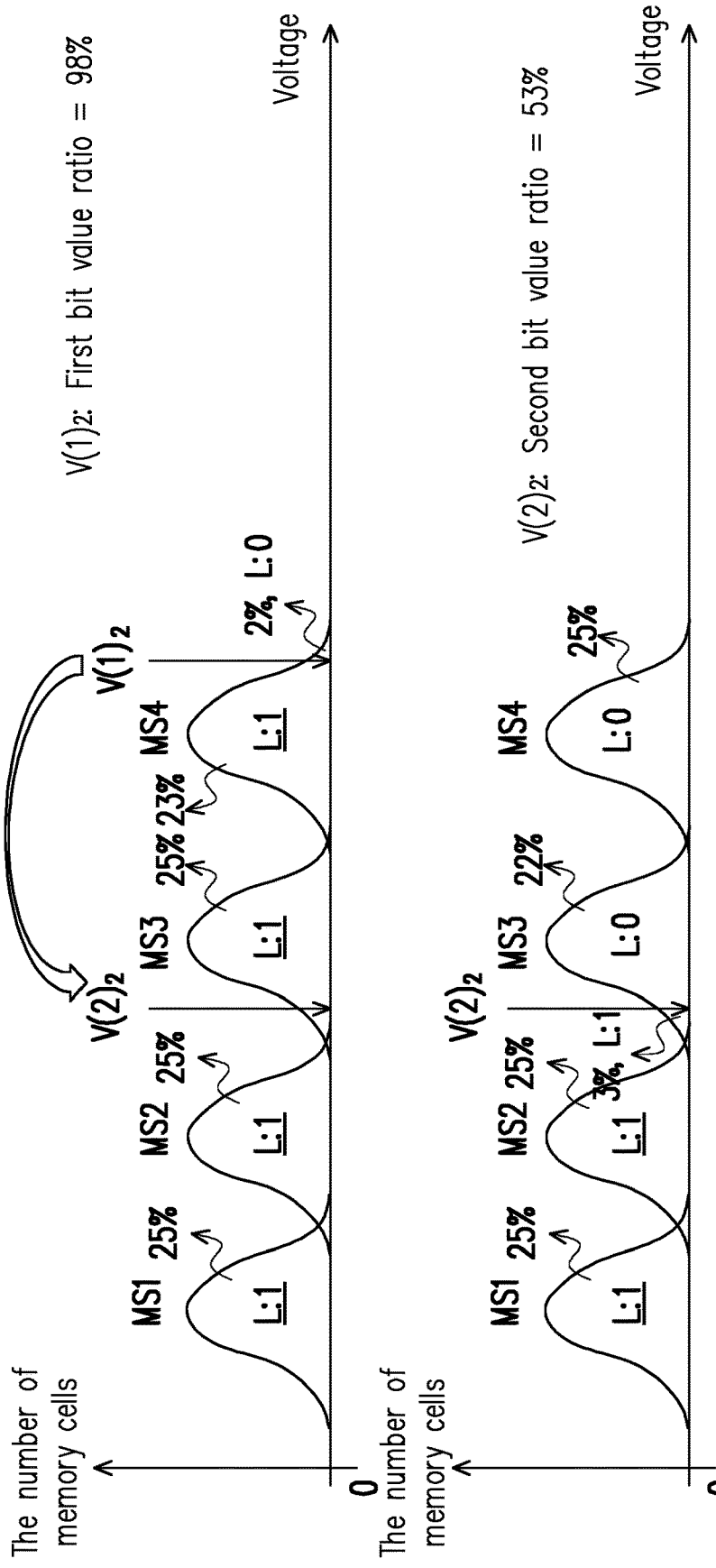

Referring to FIG. 4E, it is assumed that the rewritable non-volatile memory module 220 is an MLC, data has been written into a target physical programming unit and a threshold voltage distribution of a plurality of target memory cells into which the data has been written has an abnormal offset. In this example, because the threshold voltage distribution has the abnormal offset, a first bit value ratio obtained by reading the target physical programming unit by using a first read voltage $V(1)_1$ is 98%. This is different from the first bit value ratio (50%) in the example (the normal threshold voltage distribution of the memory cells of the physical programming unit of the MLC that has a second storage state) of the upper part of FIG. 3C. It is assumed that a condition of determining an empty unit in the conventional method is: When the bit value ratio is greater than 95%, it is determined that the corresponding physical page is empty. In this case, an empty unit identification result obtained by using the conventional method is erroneous (Because 98% is greater than 95%, the physical page with the threshold voltage distribution having the abnormal offset in FIG. 4E is determined to be empty.)

According to the empty unit identification operation/method provided in the embodiment, when the first bit value ratio (98%) corresponding to the first read voltage $V(1)_1$ is not less than a first preset threshold (for example, 90%), the empty unit management circuit module 215 uses a second read voltage $V(2)_1$ (shown by the arrow A405) to read the physical programming unit, to obtain a second bit value ratio (53%, that is, 25%+25%+3%) (for example, the example of the lower part of FIG. 4E). The empty unit management circuit module 215 further calculates an absolute difference value between the first bit value ratio and the second bit value ratio. In this example, it is assumed that a second preset threshold is 15%. The calculated absolute difference value is 45%, which is greater than the second preset threshold.

Therefore, the empty unit management circuit module 215 determines that the physical page of the physical programming unit is non-empty. In this way, when the threshold voltage distribution of the plurality of memory cells of the physical page of the physical programming unit has an abnormal offset, the empty unit identification operation/method provided in the embodiment still can effectively and precisely determine whether the physical page is empty, thereby avoiding an erroneous empty unit identification result caused by the conventional method.

In the embodiment, when "the target physical programming unit has a first type physical page and a second type physical page" and "data is first written into the first type physical page and then written into the second type physical page" (for example, the MLC or TLC/QLC), if it is determined that the first type physical page of the target physical programming unit is empty, the empty unit management circuit module 215 (for example, the empty unit determining circuit 2152) may directly determine that the second type physical page of the target physical programming unit is empty.

On the contrary, if it is determined that the first type physical page of the target physical programming unit is non-empty, the Gray code counting circuit 2151 performs an empty unit identification operation on the second type physical page: The Gray code counting circuit 2151 separately uses a plurality of third read voltages and a plurality of fourth read voltages to read the second type physical page, to obtain a corresponding third bit value ratio and fourth bit value ratio, thereby determining whether the second type physical page is empty based on the third bit value ratio and the fourth bit value ratio. Specifically, the Gray code counting circuit 2151 uses a plurality of third read voltages corresponding to the target physical programming unit to read a plurality of target memory cells of the target physical programming unit, to identify a plurality of third target memory cells storing the first bit value in the plurality of target memory cells, and calculates the third bit value ratio based on the plurality of third target memory cells and the plurality of target memory cells.

It should be noted that, when the storage controller 210 or the rewritable non-volatile memory module 220 has a writing mark mechanism, and no data is written into the second type physical page, a writing mark corresponding to a second type physical page into which data has been written is recorded as a specific bit value (In other words, the writing mark of the specific bit value indicates that the corresponding physical page is empty). When a read voltage is used for reading a second type physical page whose writing mark is recorded as second type physical page with the specific bit value, it is mandatory that all memory cells of the second type physical page whose storage states are "1" are read (that is, a bit value ratio of a physical page whose corresponding writing mark is a specific bit value must be 100%). Therefore, corresponding to this case, in one embodiment, when the storage controller 210 or the rewritable non-volatile memory module 220 has a writing mark mechanism, if the third bit value ratio is equal to 100% (also referred to as a preset value), the empty unit determining circuit 2152 may directly determine that the second type physical page of the target physical programming unit is empty.

If the third bit value ratio is not equal to the preset value (that is, 100%), the Gray code counting circuit 2151 uses a plurality of fourth read voltages corresponding to the target physical programming unit to read a plurality of target memory cells, to identify a plurality of fourth target memory cells storing the first bit value in the plurality of target memory cells, and calculates the fourth bit value ratio based on the plurality of fourth target memory cells and the plurality of target memory cells.

The plurality of fourth read voltages may be adjusted or preset based on the plurality of third read voltages. In addition, the plurality of third read voltages and the plurality of fourth read voltages are used for identifying bit values stored on the second type physical page of the target physical programming unit (that is, the plurality of third read voltages and the plurality of fourth read voltages are a plurality of read voltages used for distinguishing/identifying storage states of the memory cells on the second type physical page of the target physical programming unit.)

Finally, the empty unit determining circuit 2152 may determine whether the second type physical page of the target physical programming unit is empty by comparing the third bit value ratio and the fourth bit value ratio.

Compared with the foregoing operation of "determining whether the first type physical page of the target physical programming unit is empty by comparing the first bit value ratio and the second bit value ratio", in the foregoing operation of "determining whether the second type physical page of the target physical programming unit is empty by comparing the third bit value ratio and the fourth bit value ratio", if an absolute difference value between the third bit value ratio and the fourth bit value ratio is greater than a third preset threshold, the empty unit determining circuit 2152 determines that the second type physical page of the target physical programming unit is non-empty. On the contrary, if the absolute difference value between the third bit value ratio and the fourth bit value ratio is not greater than the third preset threshold, the empty unit determining circuit 2152 determines that the second type physical page of the target physical programming unit is empty. A manufacture may design a value, for example, 15%, of the second preset threshold according to a need and a physical characteristic of the rewritable non-volatile memory module 220. However, a specific value of the second preset threshold is not limited in the invention, and the second preset threshold may be another value different from 15%. For example, a value range of the second preset threshold is 10% to 20%.

Details about the empty unit identification operation corresponding to the second type physical page will be described below by using examples.

Referring to FIG. 4B, it is assumed that the target physical programming unit has a first type storage state. As described above, the empty unit management circuit module 215 first performs an empty unit identification operation corresponding to the first type physical page of the target physical programming unit. The empty unit management circuit module 215 obtains the first bit value ratio equal to 50% by using the first read voltage $V(1)_2$ corresponding to the first type physical page, and determines that the first type physical page of the target physical programming unit is non-empty. Next, the empty unit management circuit module 215 begins to perform an empty unit identification operation corresponding to the second type physical page of the target physical programming unit (it is assumed that a corresponding third preset threshold is 15%). That is, the empty unit management circuit module 215 first uses the read voltages $V(1)_1$ and $V(1)_3$ (also referred to as the third read voltage) corresponding to the second type physical page to read the target physical programming unit, and calculates the corresponding bit value ratio (50%) (that is, the third bit value ratio). Next, the empty unit management circuit module 215 may adjust the read voltages $V(1)_1$ and $V(1)_3$ to be the read voltages $V(2)_1$ and $V(2)_3$ (shown by arrows 401 and 402), uses the read voltage $V(2)_1$ and $V(2)_3$ (also referred to as the fourth read voltage) to read the target physical programming unit, and calculate the corresponding bit value ratio (50%) (that is, the fourth bit value ratio). Finally, the empty unit management circuit module 215 may calculate the absolute difference value between the third bit value ratio and the fourth bit value ratio as 0%, and the empty unit management circuit module 215 determines that the second type physical page is empty (This is because the absolute difference value between the third bit value ratio and the fourth bit value ratio is not greater than the third preset threshold.) In this way, the empty unit identification operation for the target physical programming unit is completed, and the obtained identification result confirms with the first type storage state (that is, the first type physical page is non-empty and the second type physical page is empty).

Referring to FIG. 4C, it is assumed that the target physical programming unit has a second type storage state. As described above, the empty unit management circuit module 215 first performs an empty unit identification operation corresponding to the first type physical page of the target physical programming unit. The empty unit management circuit module 215 obtains the first bit value ratio equal to 50% by using the first read voltage $V(1)_2$ corresponding to the first type physical page, and determines that the first type physical page of the target physical programming unit is non-empty. Next, the empty unit management circuit module 215 begins to perform an empty unit identification operation corresponding to the second type physical page of the target physical programming unit (it is assumed that a corresponding third preset threshold is 15%). That is, the empty unit management circuit module 215 uses the third read voltages $V(1)_1$ and $V(1)_3$ (read voltages $V(1)_2$ and $V(1)_3$ used for identifying/distinguishing storage states of memory cells in the physical page) corresponding to the second type physical page (for example, the upper physical page) to read the target physical programming unit, to identify a plurality of third target memory cells storing the bit value "1" (that is, the first bit value) in the plurality of target memory cells of the target physical programming unit. The empty unit management circuit module 215 calculates the third bit value ratio based on the plurality of third target memory cells and the plurality of target memory cells, that is, uses a ratio calculated through dividing the total number of the plurality of third target memory cells by the total number of the plurality of target memory cells as the third bit value ratio. In this example, the calculated third bit value ratio is 50%, which includes 25% occupied by a plurality of memory cells (a memory cell having a threshold voltage less than the read voltage $V(1)_1$ is determined to have a storage state of "1") with the threshold voltage distribution MS1 and 25% occupied by a plurality of memory cells with the threshold voltage distribution MS4 (a memory cell having a threshold voltage less than the read voltage $V(1)_3$ is determined to have a storage state of "1").

Next, the empty unit management circuit module 215 may adjust the read voltage $V(1)_1$ and $V(1)_3$ to be the read voltage $V(2)_1$ and $V(2)_3$ (shown by arrows 403 and 404). Referring to FIG. 4D, the empty unit management circuit module 215 uses the read voltage $V(2)_1$ and $V(2)_3$ to read the target physical programming unit, and calculates the corresponding bit value ratio (25%) (that is, the fourth bit value ratio). Then, the empty unit management circuit module 215 may calculate the absolute difference value between the third bit value ratio and the fourth bit value ratio as 25%, and determines that the second type physical page is non-empty (This is because the absolute difference value between the third bit value ratio and the fourth bit value ratio is greater than the third preset threshold). In this way, the empty unit identification operation for the target physical programming unit is completed, and the obtained identification result confirms with the second type storage state (that is, the first type physical page is non-empty and the second type physical page is non-empty).

FIG. 4B to FIG. 4D are examples taken based on a physical programming unit with a normal threshold voltage distribution. In the descriptions in FIG. 4E, as described above, the empty identification operation/method in the invention may also be applied to a physical programming unit with a threshold voltage distribution having an abnormal offset (for the first type physical page). That the empty identification operation/method in the invention may also be applied to a physical programming unit with a threshold voltage distribution having an abnormal offset (for the second type physical page) may further be described by using FIG. 4F.

Figure 4F:
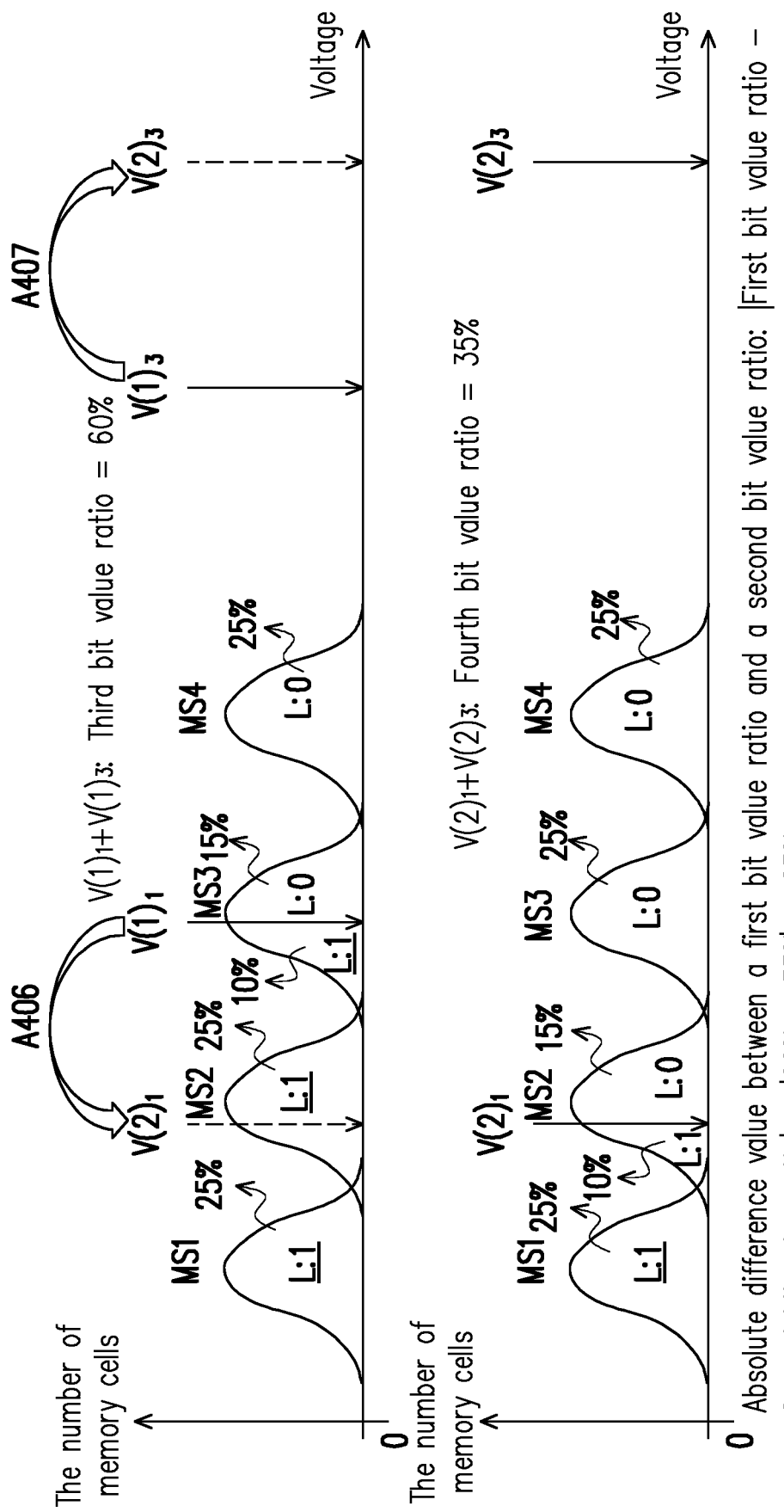
FIG. 4F is a schematic diagram of a physical programming unit with a threshold voltage distribution having an abnormal offset and to which an empty identification operation/method is applied according to one embodiment of the invention.

Referring to FIG. 4F, it is assumed that the target physical programming unit has a second type storage state. Because it has been determined that the first type physical page is non-empty (the example in FIG. 4E), then the empty unit management circuit module 215 begins to perform an empty unit identification operation corresponding to the second type physical page of the target physical programming unit (assuming that the corresponding third preset threshold is 15%). That is, the empty unit management circuit module 215 first uses the read voltages $V(1)_1$ and $V(1)_3$ (also referred to as the third read voltage) corresponding to the second type physical page to read the target physical programming unit, and calculates the corresponding bit value ratio (60%) (that is, the third bit value ratio). Next, the empty unit management circuit module 215 may adjust the read voltage $V(1)_1$ and $V(1)_3$ to be the read voltage $V(2)_1$ and $V(2)_3$ (shown by arrows 406 and 407), use the read voltage $V(2)_1$ and $V(2)_3$ (also referred to as the fourth read voltage) to read the target physical programming unit, and calculate the corresponding bit value ratio (35%) (that is, the fourth bit value ratio). Finally, the empty unit management circuit module 215 may calculate the absolute difference value between the third bit value ratio and the fourth bit value ratio as 25%, and the empty unit management circuit module 215 determines that the second type physical page is non-empty (This is because the absolute difference value between the third bit value ratio and the fourth bit value ratio is greater than the third preset threshold). In this way, the empty unit identification operation for the target physical programming unit is completed, and the obtained identification result confirms with the second type storage state (that is, the first type physical page is non-empty and the second type physical page is non-empty).

It should be noted that in the foregoing embodiments, the bit value ratio is referred to as a percentage occupied by memory cells corresponding to a storage state of "1", and the corresponding preset value and the plurality of preset thresholds are designed based on this spirit. However, the invention is not limited thereto. For example, in another embodiment, the empty unit management circuit module 215 uses a percentage of memory cells for a storage state of "0" as the "bit value ratio", and the corresponding preset value and the plurality of preset thresholds are designed accordingly. Basically, the preset value and the plurality of preset thresholds that are designed when "the bit value ratio refers to a percentage occupied by memory cells corresponding to a storage state of "0"" and the preset value and the plurality of preset thresholds that are designed when "the bit value ratio refers to a percentage occupied by memory cells corresponding to a storage state of "1"" have corresponding associations (This is because bit values that can be stored in one type of physical page can only be "1" or "0", and the sum of ratios occupied by each type of bit values is 100%).

The foregoing embodiments are described by using examples of the SLC and the MLC, and from the foregoing examples, persons skilled in the art may know how to perform an empty unit identification operation corresponding to the TLC. For example, referring to FIG. 5, in an empty unit identification operation corresponding to a first type physical page of a physical programming unit of the TLC, the empty unit management circuit module 215 may determine whether the first type physical page is empty by using the first read voltage $V(1)_4$ and the second read voltage $V(2)_4$ (shown by an example A500). If it is determined that the first type physical page is empty, the empty unit management circuit module 215 may directly determine that the second type physical page is empty. If it is determined that the first type physical page is non-empty, the empty unit management circuit module 215 may perform an empty unit identification operation corresponding to a second type physical page, and determine whether the second type physical page is empty by using the third read voltages $V(1)_1$, $V(1)_2$, $V(1)_5$, and $V(1)_7$ and the correspondingly adjusted fourth read voltages $V(1)_1$, $V(1)_2$, $V(1)_5$, and $V(1)_7$ (shown by arrows A501 to A504). A voltage adjustment manner is basically shown in FIG. 5. The read voltage $V(1)_4$ is used as a center, a read voltage located at the left side of the read voltage $V(1)_4$ is adjusted to the left (a better accuracy/identification degree is obtained when the read voltage is adjusted more to the left), and a read voltage located at the right side of the read voltage $V(1)_4$ is adjusted to the right (a better accuracy/identification degree is obtained when the read voltage is adjusted more to the right).

It should be noted that in one embodiment, if the corresponding physical page (for example, the first type physical page) needs only one read voltage (for example, the corresponding first read voltage) to perform reading, the operation of adjusting the first read voltage $V(1)_4$ corresponding to the first type physical page to be the second read voltage $V(2)_4$ can only be performed to the left (or to the leftmost). In one embodiment, if the corresponding physical page (for example, the second type physical page) needs two or more read voltages (for example, a plurality of third read voltages) to perform reading, when the read voltages is adjusted, the leftmost read voltage (the minimum voltage value) in the plurality of third read voltages is adjusted to the left, and the rightmost read voltage (the maximum voltage value) in the plurality of third read voltages is adjusted to the right. Next, another bit value ratio of the adjusted read voltage is obtained, to determine whether the corresponding physical page is empty based on an absolute difference value between the another bit value ratio and the original bit value ratio (obtained by using a plurality of third read voltages before adjustment). In addition, the foregoing empty unit identification method and the read voltage adjustment method may also be applied to identification of an empty unit of the QLC.

Figure 6A:
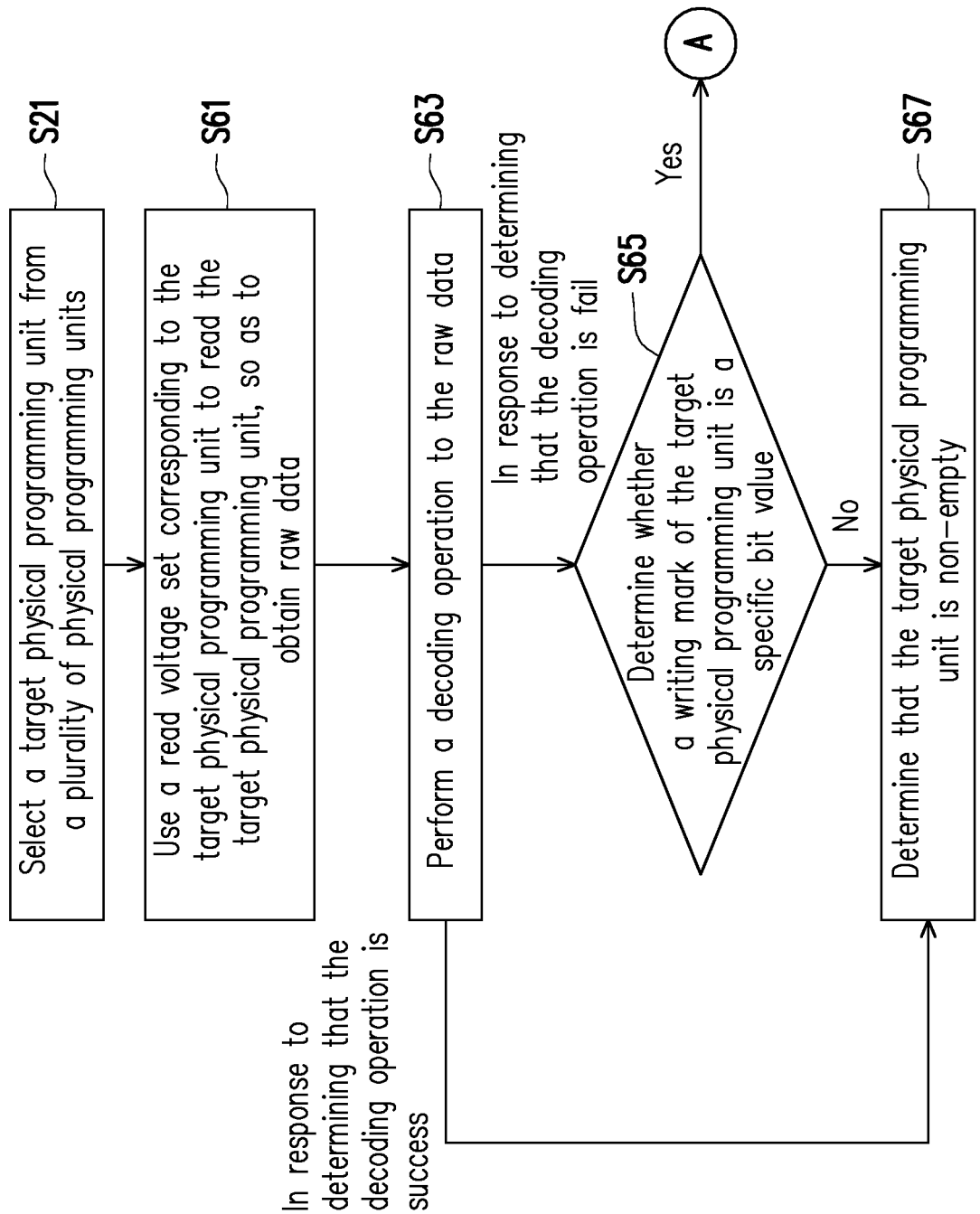
FIGS. 6A and 6B together is a flowchart of a memory management method according to one embodiment of the invention.
Figure 6B:
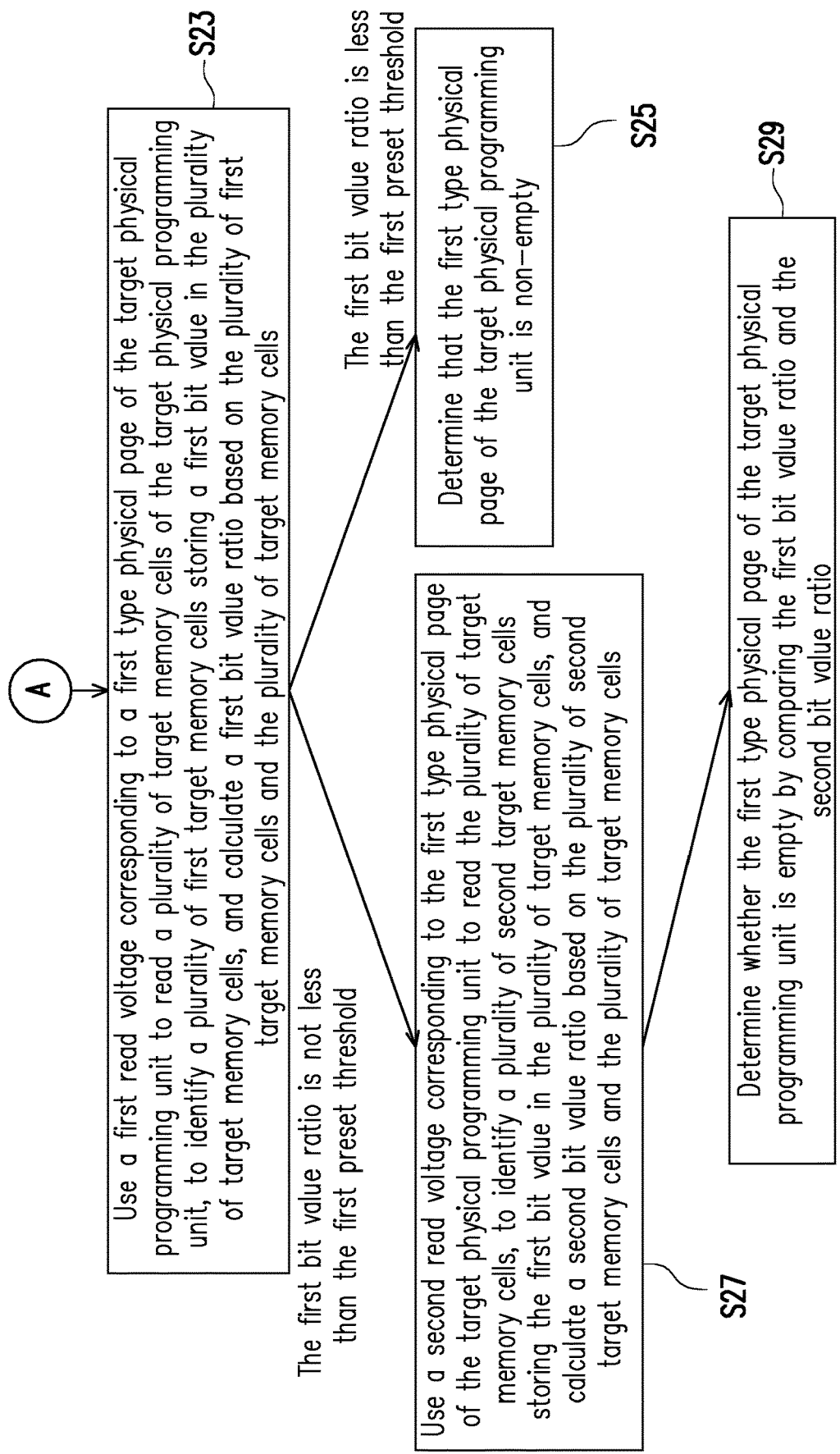

Furthermore, in an embodiment, a modified memory management method is provided, which may increase the speed for determining whether the target physical programming unit is empty or non-empty. FIGS. 6A and 6B (also referred to as FIG. 6) together is a flowchart of a memory management method according to one embodiment of the invention. FIG. 6 is like FIG. 2, the steps S21, S23, S25, S27 and S29 are the same as the steps in FIG. 2. Referring to both FIG. 1 and FIG. 6, in step S21, the processor 211 selects a target physical programming unit from a plurality of physical programming units of the rewritable non-volatile memory module. Next, in the processor 211 would perform a pre-checking operation (e.g., steps S61, S63, and S65) to the target physical programming unit before entering the step S23.

Specifically, in step S61 the processor 211 may use a read voltage set corresponding to the target physical programming unit to read the target physical programming unit, so as to obtain raw data (e.g., the processor 211 performs a read operation on the target physical programming unit). The read voltage set corresponding to the target physical programming unit maybe a optimized read voltage set corresponding to the target physical programming unit, or a prese read voltage set corresponding to the target physical programming unit, wherein the read voltage set includes one or more read voltages for reading data stored in the target physical programming unit. The read raw data is the data via the reading operation before a corresponding decoding operation for the raw data.

Next, in step S63, the processor performs a decoding operation to the raw data. After the decoding operation is completed, a decoding result which indicates whether the decoding operation is fail or success would be determined. In response to determining that the decoding operation is fail, continuing to step S65, the processor 211 determines whether a writing mark of the target physical programming unit is a specific bit value. The specific bit value may be set by, for example, "1" or "0", the invention is not limited thereto. If the writing mark is not the specific bit value, continuing to step S67, the processor 211 directly determines that the target physical programming unit is non-empty. In the other hand, if the writing mark is the specific bit value, continuing to step S67 (via point A), the processor 211 performs step S23.

Furthermore, after the step S63 is completed, in response to determining that the decoding operation is success, continuing to step S67, the processor 211 directly determines that the target physical programming unit is non-empty. In other words, in this embodiment, if the condition "S63→S67" or the condition "S65→S67" occurs, the whole flow would not enter steps S23 to S29, such that the whole processing time spent for determining whether the target physical programming unit is empty (or non-empty) would be drastically decreased.

Based on the above, according to the memory management method and the storage controller provided in the embodiments of the invention, different bit value ratios obtained by using read voltages may be used for identifying whether a storage unit is empty, so to improve the empty storage unit identification accuracy, thereby improving the efficiency of managing used space and unused space by the storage device.

Although the invention is disclosed by using the foregoing embodiments, the embodiments are not intended to limit the invention. Any person skilled in the art may make some variations and modifications without departing from the spirit and scope of the invention. Therefore, the protection scope of the invention is subject to scope of the following claims.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory management method, applicable to a storage device configured with a rewritable non-volatile memory module, wherein the rewritable non-volatile memory module comprises a plurality of physical programming units, and each of the physical programming units comprises a plurality of memory cells; and the method comprises:
   selecting a target physical programming unit from the physical programming units;
   using a first read voltage corresponding to the target physical programming unit to read a plurality of target memory cells of the target physical programming unit, to identify a plurality of first target memory cells storing a first bit value in the target memory cells, and calculating a first bit value ratio based on the first target memory cells and the target memory cells;
   if the first bit value ratio is less than a first preset threshold, determining that a first type physical page of the target physical programming unit is non-empty;
   if the first bit value ratio is not less than the first preset threshold, using a second read voltage corresponding to the target physical programming unit to read the target memory cells, to identify a plurality of second target memory cells storing the first bit value in the target memory cells, and calculating a second bit value ratio based on the second target memory cells and the target memory cells, wherein the second read voltage is different from the first read voltage, and the first read voltage and the second read voltage are used for identifying a bit value stored on the first type physical page of the target physical programming unit; and
   determining whether the first type physical page of the target physical programming unit is empty by comparing the first bit value ratio and the second bit value ratio.

2. The memory management method according to claim 1, wherein the step of determining whether the first type physical page of the target physical programming unit is empty by comparing the first bit value ratio and the second bit value ratio comprises:
   determining that the first type physical page of the target physical programming unit is non-empty if an absolute difference value between the first bit value ratio and the second bit value ratio is greater than a second preset threshold; and
   determining that the first type physical page of the target physical programming unit is empty if the absolute difference value between the first bit value ratio and the second bit value ratio is not greater than the second preset threshold.

3. The memory management method according to claim 1, wherein the memory management method further comprises:
   determining that a second type physical page of the target physical programming unit is empty if it is determined that the first type physical page of the target physical programming unit is empty.

4. The memory management method according to claim 1, wherein the memory management method further comprises:
if it is determined that the first type physical page of the target physical programming unit is non-empty, using a plurality of third read voltages corresponding to the target physical programming unit to read the target memory cells of the target physical programming unit, to identify a plurality of third target memory cells storing the first bit value in the target memory cells, and calculating a third bit value ratio based on the third target memory cells and the target memory cells;
if the third bit value ratio is not equal to a preset value, using a plurality of fourth read voltages corresponding to the target physical programming unit to read the target memory cells, to identify a plurality of fourth target memory cells storing the first bit value in the target memory cells, and calculating a fourth bit value ratio based on the fourth target memory cells and the target memory cells, wherein the third read voltages and the fourth read voltages are used for identifying a bit value stored on the second type physical page of the target physical programming unit; and
determining whether the second type physical page of the target physical programming unit is empty by comparing the third bit value ratio and the fourth bit value ratio.

5. The memory management method according to claim 4, wherein the step of determining whether the second type physical page of the target physical programming unit is empty by comparing the third bit value ratio and the fourth bit value ratio comprises:
determining that the second type physical page of the target physical programming unit is non-empty if an absolute difference value between the third bit value ratio and the fourth bit value ratio is greater than a third preset threshold; and
determining that the second type physical page of the target physical programming unit is empty if the absolute difference value between the third bit value ratio and the fourth bit value ratio is not greater than the third preset threshold.

6. The memory management method according to claim 5, further comprising:
determining that the second type physical page of the target physical programming unit is empty if the third bit value ratio is equal to the preset value.

7. A storage controller, configured to control a storage device configured with a rewritable non-volatile memory module, wherein the storage controller comprises:
a connection interface circuit, configured to be coupled to a host system;
a memory interface control circuit, configured to be coupled to the rewritable non-volatile memory module, wherein the rewritable non-volatile memory module comprises a plurality of physical programming units, and each of the physical programming units comprises a plurality of memory cells;
an empty unit management circuit unit; and
a processor, coupled to the connection interface circuit, the memory interface control circuit, and the empty unit management circuit unit, wherein the processor selects a target physical programming unit from the physical programming units to instruct the empty unit management circuit unit to perform an empty unit identification operation on the target physical programming unit; and
in the empty unit identification operation,
the empty unit management circuit unit is configured to: use a first read voltage corresponding to the target physical programming unit to read a plurality of target memory cells of the target physical programming unit, to identify a plurality of first target memory cells storing a first bit value in the target memory cells, and calculate a first bit value ratio based on the first target memory cells and the target memory cells;
if the first bit value ratio is less than a first preset threshold, the empty unit management circuit unit determines that a first type physical page of the target physical programming unit is non-empty;
if the first bit value ratio is not less than the first preset threshold, the empty unit management circuit unit is further configured to: use a second read voltage corresponding to the target physical programming unit to read the target memory cells, to identify a plurality of second target memory cells storing the first bit value in the target memory cells, and calculate a second bit value ratio based on the second target memory cells and the target memory cells, wherein the second read voltage is different from the first read voltage, and the first read voltage and the second read voltage are used for identifying a bit value stored on the first type physical page of the target physical programming unit; and
the empty unit management circuit unit is further configured to determine whether the first type physical page of the target physical programming unit is empty by comparing the first bit value ratio and the second bit value ratio.

8. The storage controller according to claim 7, wherein in the operation in which the empty unit management circuit unit is further configured to determine whether the first type physical page of the target physical programming unit is empty by comparing the first bit value ratio and the second bit value ratio,
the empty unit management circuit unit determines that the first type physical page of the target physical programming unit is non-empty if an absolute difference value between the first bit value ratio and the second bit value ratio is greater than a second preset threshold; and
the empty unit management circuit unit determines that the first type physical page of the target physical programming unit is empty if the absolute difference value between the first bit value ratio and the second bit value ratio is not greater than the second preset threshold.

9. The storage controller according to claim 7, wherein the empty unit management circuit unit determines that a second type physical page of the target physical programming unit is empty if it is determined that the first type physical page of the target physical programming unit is empty.

10. The storage controller according to claim 7, wherein if it is determined that the first type physical page of the target physical programming unit is non-empty, the empty unit management circuit unit uses a plurality of third read voltages corresponding to the target physical programming unit to read the target memory cells of the target physical programming unit, to identify a plurality of third target memory cells storing the first bit value in the target memory cells, and calculates a third bit value ratio based on the third target memory cells and the target memory cells;

if the third bit value ratio is not equal to a preset value, the empty unit management circuit unit uses a plurality of fourth read voltages corresponding to the target physical programming unit to read the target memory cells, to identify a plurality of fourth target memory cells storing the first bit value in the target memory cells, and calculates a fourth bit value ratio based on the fourth target memory cells and the target memory cells, wherein the third read voltages and the fourth read voltages are used for identifying a bit value stored on the second type physical page of the target physical programming unit; and the empty unit management circuit unit determines whether the second type physical page of the target physical programming unit is empty by comparing the third bit value ratio and the fourth bit value ratio.

11. The storage controller according to claim 10, wherein in the operation in which the empty unit management circuit unit determines whether the second type physical page of the target physical programming unit is empty by comparing the third bit value ratio and the fourth bit value ratio, the empty unit management circuit unit determines that the second type physical page of the target physical programming unit is non-empty if an absolute difference value between the third bit value ratio and the fourth bit value ratio is greater than a third preset threshold; and the empty unit management circuit unit determines that the second type physical page of the target physical programming unit is empty if the absolute difference value between the third bit value ratio and the fourth bit value ratio is not greater than the third preset threshold.

12. The storage controller according to claim 11, wherein the empty unit management circuit unit determines that the second type physical page of the target physical programming unit is empty if the third bit value ratio is equal to the preset value.

* * * * *